US009425764B2

(12) United States Patent
Burak et al.

(10) Patent No.: US 9,425,764 B2
(45) Date of Patent: Aug. 23, 2016

(54) ACCOUSTIC RESONATOR HAVING COMPOSITE ELECTRODES WITH INTEGRATED LATERAL FEATURES

(71) Applicant: Avago Technologies General IP (Singapore) Pte. Ltd., Singapore (SG)

(72) Inventors: Dariusz Burak, Fort Collins, CO (US); Phil Nikkel, Loveland, CO (US); Chris Feng, Fort Collins, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 260 days.

(21) Appl. No.: 13/660,941

(22) Filed: Oct. 25, 2012

(65) Prior Publication Data
US 2014/0118088 A1    May 1, 2014

(51) Int. Cl.
H03H 9/13    (2006.01)
H03H 9/15    (2006.01)
H03H 9/02    (2006.01)
H03H 9/17    (2006.01)

(52) U.S. Cl.
CPC ........... *H03H 9/02118* (2013.01); *H03H 9/131* (2013.01); *H03H 9/173* (2013.01); *H03H 9/175* (2013.01)

(58) Field of Classification Search
CPC ... H03H 9/02; H03H 9/02086; H03H 9/0211; H03H 9/02118; H03H 9/17; H03H 9/171; H03H 9/173; H03H 9/174; H03H 9/175; H03H 9/131; H03H 9/132
USPC .................................. 333/187, 189; 310/312
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |

(Continued)

FOREIGN PATENT DOCUMENTS

| | | |
|---|---|---|
| CN | 1171382 C | 10/2004 |
| CN | 101170303 | 9/2011 |

(Continued)

OTHER PUBLICATIONS

U.S. Appl. No. 13/232,334, filed Sep. 14, 2011.

(Continued)

*Primary Examiner* — Barbara Summons

(57) ABSTRACT

A bulk acoustic wave (BAW) resonator device includes a bottom electrode on a substrate over one of a cavity and an acoustic reflector, a piezoelectric layer on the bottom electrode, and a top electrode on the piezoelectric layer. At one of the bottom electrode and the top electrode is a composite electrode having an integrated lateral feature, arranged between planar top and bottom surfaces of the composite electrode and configured to create a cut-off frequency mismatch.

17 Claims, 5 Drawing Sheets

(56) References Cited

U.S. PATENT DOCUMENTS

| | | |
|---|---|---|
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,815,054 A | 9/1998 | Vojak et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita et al. |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,291,931 B1 | 9/2001 | Lakin |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,679 B1 | 5/2002 | Lorenz |
| 6,384,697 B1 | 5/2002 | Ruby |
| 6,396,200 B2 * | 5/2002 | Misu et al. ............... 310/348 |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,054 B2 | 4/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |

(56) References Cited

U.S. PATENT DOCUMENTS

| | | | |
|---|---|---|---|
| 6,559,530 | B2 | 5/2003 | Hinzel et al. |
| 6,564,448 | B1 | 5/2003 | Oura et al. |
| 6,566,956 | B2 | 5/2003 | Ohnishi et al. |
| 6,566,979 | B2 | 5/2003 | Larson et al. |
| 6,580,159 | B1 | 6/2003 | Fusaro et al. |
| 6,583,374 | B2 | 6/2003 | Knieser et al. |
| 6,583,688 | B2 | 6/2003 | Klee et al. |
| 6,593,870 | B2 | 7/2003 | Dummermuth et al. |
| 6,594,165 | B2 | 7/2003 | Duerbaum et al. |
| 6,600,390 | B2 | 7/2003 | Frank |
| 6,601,276 | B2 | 8/2003 | Barber |
| 6,603,182 | B1 | 8/2003 | Low et al. |
| 6,617,249 | B2 | 9/2003 | Ruby et al. |
| 6,617,750 | B2 | 9/2003 | Dummermuth et al. |
| 6,617,751 | B2 | 9/2003 | Sunwoo et al. |
| 6,621,137 | B1 | 9/2003 | Ma et al. |
| 6,630,753 | B2 | 10/2003 | Malik et al. |
| 6,635,509 | B1 | 10/2003 | Ouellet |
| 6,639,872 | B1 | 10/2003 | Rein |
| 6,650,205 | B2 | 11/2003 | Goetz et al. |
| 6,651,488 | B2 | 11/2003 | Larson et al. |
| 6,657,363 | B1 | 12/2003 | Aigner |
| 6,668,618 | B2 | 12/2003 | Larson et al. |
| 6,670,866 | B2 | 12/2003 | Ella et al. |
| 6,677,929 | B2 | 1/2004 | Gordon et al. |
| 6,693,500 | B2 | 2/2004 | Yang et al. |
| 6,709,776 | B2 | 3/2004 | Noguchi et al. |
| 6,710,508 | B2 | 3/2004 | Ruby et al. |
| 6,710,681 | B2 | 3/2004 | Figueredo et al. |
| 6,713,314 | B2 | 3/2004 | Wong et al. |
| 6,714,102 | B2 | 3/2004 | Ruby et al. |
| 6,720,844 | B1 | 4/2004 | Lakin |
| 6,720,846 | B2 | 4/2004 | Iwashita et al. |
| 6,724,266 | B2 | 4/2004 | Plazza et al. |
| 6,738,267 | B1 | 5/2004 | Navas Sabater et al. |
| 6,750,593 | B2 | 6/2004 | Iwata |
| 6,774,746 | B2 | 8/2004 | Whatmore et al. |
| 6,777,263 | B1 | 8/2004 | Gan et al. |
| 6,787,048 | B2 | 9/2004 | Bradley et al. |
| 6,787,897 | B2 | 9/2004 | Geefay et al. |
| 6,788,170 | B1 | 9/2004 | Kaitila et al. |
| 6,803,835 | B2 | 10/2004 | Frank |
| 6,812,619 | B1 | 11/2004 | Kaitila et al. |
| 6,820,469 | B1 | 11/2004 | Adkins et al. |
| 6,828,713 | B2 | 12/2004 | Bradley et al. |
| 6,842,088 | B2 | 1/2005 | Yamada et al. |
| 6,842,089 | B2 | 1/2005 | Lee |
| 6,849,475 | B2 | 2/2005 | Kim |
| 6,853,534 | B2 | 2/2005 | Williams |
| 6,861,920 | B2 | 3/2005 | Ishikawa et al. |
| 6,864,619 | B2 | 3/2005 | Aigner et al. |
| 6,872,931 | B2 | 3/2005 | Liess et al. |
| 6,873,065 | B2 | 3/2005 | Haigh et al. |
| 6,873,529 | B2 | 3/2005 | Ikuta |
| 6,874,211 | B2 | 4/2005 | Bradley et al. |
| 6,874,212 | B2 | 4/2005 | Larson |
| 6,888,424 | B2 | 5/2005 | Takeuchi et al. |
| 6,894,588 | B2 | 5/2005 | Detlefsen |
| 6,900,705 | B2 | 5/2005 | Nakamura et al. |
| 6,903,452 | B2 | 6/2005 | Ma et al. |
| 6,906,451 | B2 | 6/2005 | Yamada et al. |
| 6,911,708 | B2 | 6/2005 | Park |
| 6,917,261 | B2 | 7/2005 | Unterberger |
| 6,919,222 | B2 | 7/2005 | Geefay |
| 6,924,583 | B2 | 8/2005 | Lin et al. |
| 6,924,717 | B2 | 8/2005 | Ginsburg et al. |
| 6,927,651 | B2 | 8/2005 | Larson et al. |
| 6,933,809 | B2 | 8/2005 | Kyoung et al. |
| 6,936,837 | B2 | 8/2005 | Yamada et al. |
| 6,936,928 | B2 | 8/2005 | Hedler et al. |
| 6,936,954 | B2 | 8/2005 | Peczalski |
| 6,941,036 | B2 | 9/2005 | Lucero |
| 6,943,647 | B2 | 9/2005 | Aigner |
| 6,943,648 | B2 | 9/2005 | Maiz et al. |
| 6,946,928 | B2 | 9/2005 | Larson et al. |
| 6,954,121 | B2 | 10/2005 | Bradley et al. |
| 6,963,257 | B2 | 11/2005 | Ella et al. |
| 6,970,365 | B2 | 11/2005 | Tuchi |
| 6,975,183 | B2 | 12/2005 | Aigner et al. |
| 6,977,563 | B2 | 12/2005 | Komuro et al. |
| 6,979,597 | B2 | 12/2005 | Geefay et al. |
| 6,985,051 | B2 | 1/2006 | Nguyen et al. |
| 6,985,052 | B2 | 1/2006 | Tikka |
| 6,987,433 | B2 | 1/2006 | Larson et al. |
| 6,989,723 | B2 | 1/2006 | Komuro et al. |
| 6,998,940 | B2 | 2/2006 | Metzger |
| 7,002,437 | B2 | 2/2006 | Takeuchi et al. |
| 7,019,604 | B2 | 3/2006 | Gotoh et al. |
| 7,019,605 | B2 | 3/2006 | Larson |
| 7,026,876 | B1 | 4/2006 | Esfandiari et al. |
| 7,053,456 | B2 | 5/2006 | Matsuo |
| 7,057,476 | B2 | 6/2006 | Hwu |
| 7,057,478 | B2 | 6/2006 | Korden et al. |
| 7,064,606 | B2 | 6/2006 | Louis |
| 7,084,553 | B2 | 8/2006 | Ludwiczak |
| 7,091,649 | B2 | 8/2006 | Larson et al. |
| 7,098,758 | B2 | 8/2006 | Wang et al. |
| 7,102,460 | B2 | 9/2006 | Schmidhammer et al. |
| 7,109,826 | B2 | 9/2006 | Ginsburg et al. |
| 7,128,941 | B2 | 10/2006 | Lee |
| 7,129,806 | B2 | 10/2006 | Sato |
| 7,138,889 | B2 | 11/2006 | Lakin |
| 7,161,283 | B1 | 1/2007 | Geefay |
| 7,161,448 | B2 | 1/2007 | Feng et al. |
| 7,170,215 | B2 | 1/2007 | Namba et al. |
| 7,173,504 | B2 | 2/2007 | Larson et al. |
| 7,179,392 | B2 | 2/2007 | Robert et al. |
| 7,187,254 | B2 | 3/2007 | Su et al. |
| 7,199,683 | B2 | 4/2007 | Thalhammer |
| 7,209,374 | B2 | 4/2007 | Noro |
| 7,212,083 | B2 | 5/2007 | Inoue et al. |
| 7,212,085 | B2 | 5/2007 | Wu |
| 7,230,509 | B2 | 6/2007 | Stoemmer |
| 7,230,511 | B2 | 6/2007 | Onishi et al. |
| 7,233,218 | B2 | 6/2007 | Park et al. |
| 7,235,462 | B2 | 6/2007 | Letertre et al. |
| 7,242,270 | B2 | 7/2007 | Larson et al. |
| 7,259,498 | B2 | 8/2007 | Nakatsuka et al. |
| 7,268,647 | B2 | 9/2007 | Sano et al. |
| 7,275,292 | B2 | 10/2007 | Ruby et al. |
| 7,276,994 | B2 | 10/2007 | Takeuchi et al. |
| 7,280,007 | B2 | 10/2007 | Feng et al. |
| 7,281,304 | B2 | 10/2007 | Kim et al. |
| 7,294,919 | B2 | 11/2007 | Bai |
| 7,301,258 | B2 | 11/2007 | Tanaka |
| 7,310,861 | B2 | 12/2007 | Aigner et al. |
| 7,313,255 | B2 | 12/2007 | Machida et al. |
| 7,332,985 | B2 | 2/2008 | Larson et al. |
| 7,345,409 | B2 | 3/2008 | Leidl et al. |
| 7,345,410 | B2 | 3/2008 | Grannen et al. |
| 7,358,831 | B2 | 4/2008 | Larson, III et al. |
| 7,367,095 | B2 | 5/2008 | Larson et al. |
| 7,368,857 | B2 | 5/2008 | Tanaka |
| 7,369,013 | B2 * | 5/2008 | Fazzio et al. .................. 333/187 |
| 7,385,467 | B2 | 6/2008 | Stoemmer et al. |
| 7,388,318 | B2 | 6/2008 | Yamada et al. |
| 7,388,454 | B2 | 6/2008 | Ruby et al. |
| 7,388,455 | B2 | 6/2008 | Larson |
| 7,391,286 | B2 | 6/2008 | Jamneala et al. |
| 7,400,217 | B2 | 7/2008 | Larson et al. |
| 7,408,428 | B2 | 8/2008 | Larson |
| 7,414,349 | B2 | 8/2008 | Sasaki |
| 7,414,495 | B2 | 8/2008 | Iwasaki et al. |
| 7,420,320 | B2 | 9/2008 | Sano et al. |
| 7,423,503 | B2 | 9/2008 | Larson et al. |
| 7,425,787 | B2 | 9/2008 | Larson |
| 7,439,824 | B2 | 10/2008 | Aigner |
| 7,463,118 | B2 | 12/2008 | Jacobsen |
| 7,466,213 | B2 | 12/2008 | Lobl et al. |
| 7,482,737 | B2 | 1/2009 | Yamada et al. |
| 7,508,286 | B2 | 3/2009 | Ruby et al. |
| 7,515,018 | B2 | 4/2009 | Handtmann et al. |
| 7,535,324 | B2 | 5/2009 | Fattinger et al. |
| 7,545,532 | B2 | 6/2009 | Muramoto |

(56) References Cited

U.S. PATENT DOCUMENTS

| | | |
|---|---|---|
| 7,561,009 B2 | 7/2009 | Larson, III et al. |
| 7,563,475 B2 | 7/2009 | Ruby et al. |
| 7,567,023 B2 | 7/2009 | Iwaki et al. |
| 7,575,292 B2 | 8/2009 | Furukawa |
| 7,576,471 B1 | 8/2009 | Solal |
| 7,602,101 B2 | 10/2009 | Hara et al. |
| 7,602,102 B1 | 10/2009 | Barber et al. |
| 7,619,493 B2 | 11/2009 | Uno et al. |
| 7,629,865 B2 | 12/2009 | Ruby |
| 7,636,026 B2 | 12/2009 | Heinze et al. |
| 7,649,304 B2 | 1/2010 | Umeda et al. |
| 7,655,963 B2 | 2/2010 | Sadaka et al. |
| 7,684,109 B2 | 3/2010 | Godshalk et al. |
| 7,714,684 B2 | 5/2010 | Ruby et al. |
| 7,737,807 B2 | 6/2010 | Larson et al. |
| 7,758,979 B2 | 7/2010 | Akiyama et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,869,187 B2 | 1/2011 | McKinzie |
| 7,889,024 B2 | 2/2011 | Bradley et al. |
| 7,893,793 B2 * | 2/2011 | Iwasaki et al. ................ 333/133 |
| 7,978,025 B2 | 7/2011 | Yokoyama et al. |
| 7,986,198 B2 | 7/2011 | Nakatsuka et al. |
| 8,008,993 B2 | 8/2011 | Milsom et al. |
| 8,030,823 B2 | 10/2011 | Sinha et al. |
| 8,084,919 B2 | 12/2011 | Nishihara et al. |
| 8,222,795 B2 | 7/2012 | Sinha et al. |
| 8,232,845 B2 | 7/2012 | Ruby et al. |
| 8,253,513 B2 | 8/2012 | Zhang |
| 8,330,325 B1 | 12/2012 | Burak et al. |
| 8,384,497 B2 | 2/2013 | Zhang |
| 8,456,257 B1 * | 6/2013 | Fattinger ....................... 333/187 |
| 8,575,820 B2 | 11/2013 | Shirakawa et al. |
| 9,069,005 B2 | 6/2015 | Ruby |
| 9,099,983 B2 | 8/2015 | Burak et al. |
| 9,136,819 B2 | 9/2015 | Grannen et al. |
| 9,154,112 B2 | 10/2015 | Burak |
| 9,223,248 B2 | 12/2015 | Kawano et al. |
| 9,225,313 B2 | 12/2015 | Bradley et al. |
| 2001/0045793 A1 | 11/2001 | Misu et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson et al. |
| 2002/0153965 A1 | 10/2002 | Ruby et al. |
| 2002/0158716 A1 | 10/2002 | Pensala |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthikumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2003/0213964 A1 | 11/2003 | Flynn et al. |
| 2003/0227357 A1 | 12/2003 | Metzger et al. |
| 2004/0016995 A1 | 1/2004 | Kuo et al. |
| 2004/0017130 A1 | 1/2004 | Wang et al. |
| 2004/0027216 A1 | 2/2004 | Ma et al. |
| 2004/0046622 A1 | 3/2004 | Aigner et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0188241 A1 | 9/2004 | Rich et al. |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson et al. |
| 2005/0093397 A1 | 5/2005 | Yamada et al. |
| 2005/0093653 A1 | 5/2005 | Larson |
| 2005/0093654 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0093659 A1 | 5/2005 | Larson et al. |
| 2005/0104690 A1 | 5/2005 | Larson et al. |
| 2005/0110598 A1 | 5/2005 | Larson, III et al. |
| 2005/0128030 A1 | 6/2005 | Larson et al. |
| 2005/0140466 A1 | 6/2005 | Larson et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0038636 A1 | 2/2006 | Tsurumi et al. |
| 2006/0071736 A1 | 4/2006 | Ruby et al. |
| 2006/0081048 A1 | 4/2006 | Mikado et al. |
| 2006/0087199 A1 | 4/2006 | Larson et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1 | 7/2006 | Stoemmer et al. |
| 2006/0176126 A1 | 8/2006 | Wang et al. |
| 2006/0185139 A1 | 8/2006 | Larson et al. |
| 2006/0197411 A1 | 9/2006 | Hoen et al. |
| 2006/0238070 A1 | 10/2006 | Costa et al. |
| 2006/0284706 A1 | 12/2006 | Ginsburg et al. |
| 2006/0284707 A1 | 12/2006 | Larson et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0040473 A1 | 2/2007 | Ballandras et al. |
| 2007/0069225 A1 | 3/2007 | Krames et al. |
| 2007/0080759 A1 | 4/2007 | Jamneala et al. |
| 2007/0085447 A1 | 4/2007 | Larson |
| 2007/0085631 A1 | 4/2007 | Larson et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0266548 A1 | 11/2007 | Fattinger |
| 2007/0279153 A1 | 12/2007 | Ruby |
| 2008/0042780 A1 * | 2/2008 | Lee et al. ...................... 333/187 |

(56) References Cited

U.S. PATENT DOCUMENTS

| | | |
|---|---|---|
| 2008/0055020 A1 | 3/2008 | Handtmann et al. |
| 2008/0129417 A1 | 6/2008 | Taniguchi |
| 2008/0143215 A1 | 6/2008 | Hara et al. |
| 2008/0258842 A1 | 10/2008 | Ruby et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0001848 A1 | 1/2009 | Umeda et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milsom et al. |
| 2009/0267453 A1 | 10/2009 | Barber et al. |
| 2009/0267457 A1 | 10/2009 | Barber et al. |
| 2010/0013573 A1 | 1/2010 | Umeda |
| 2010/0033063 A1 | 2/2010 | Nishihara et al. |
| 2010/0039000 A1 | 2/2010 | Milson et al. |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0111808 A1 | 5/2010 | Pimputkar et al. |
| 2010/0141353 A1* | 6/2010 | Iwaki et al. .................... 333/133 |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0187949 A1 | 7/2010 | Pahl et al. |
| 2010/0260453 A1 | 10/2010 | Block |
| 2010/0327697 A1 | 12/2010 | Choy et al. |
| 2010/0327994 A1 | 12/2010 | Choy et al. |
| 2011/0037539 A1* | 2/2011 | Jansman et al. .............. 333/187 |
| 2011/0084779 A1 | 4/2011 | Zhang |
| 2011/0121689 A1 | 5/2011 | Grannen et al. |
| 2011/0121916 A1 | 5/2011 | Barber et al. |
| 2011/0148547 A1* | 6/2011 | Zhang ........................... 333/187 |
| 2011/0180391 A1 | 7/2011 | Larson et al. |
| 2011/0204996 A1 | 8/2011 | Gilbert et al. |
| 2011/0204997 A1 | 8/2011 | Elbrecht et al. |
| 2011/0227671 A1 | 9/2011 | Zhang |
| 2011/0266925 A1 | 11/2011 | Ruby et al. |
| 2012/0154074 A1 | 6/2012 | Ruby et al. |
| 2012/0161902 A1 | 6/2012 | Feng et al. |
| 2012/0177816 A1 | 7/2012 | Larson et al. |
| 2012/0194297 A1 | 8/2012 | Choy |
| 2012/0218055 A1 | 8/2012 | Burak et al. |
| 2012/0218056 A1 | 8/2012 | Burak |
| 2012/0218057 A1 | 8/2012 | Burak et al. |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0248941 A1 | 10/2012 | Shirakawa et al. |
| 2012/0280767 A1 | 11/2012 | Burak et al. |
| 2013/0033151 A1 | 2/2013 | Ueda et al. |
| 2013/0038408 A1 | 2/2013 | Burak et al. |
| 2013/0063227 A1 | 3/2013 | Burak et al. |
| 2013/0082799 A1 | 4/2013 | Zuo et al. |
| 2013/0106534 A1 | 5/2013 | Burak et al. |
| 2013/0127300 A1 | 5/2013 | Umeda et al. |
| 2013/0140959 A1 | 6/2013 | Shin et al. |
| 2013/0205586 A1 | 8/2013 | Takada et al. |
| 2013/0235001 A1 | 9/2013 | Yun et al. |
| 2013/0241673 A1 | 9/2013 | Yokoyama et al. |
| 2014/0111288 A1 | 4/2014 | Nikkel et al. |
| 2014/0118087 A1 | 5/2014 | Burak et al. |
| 2014/0118088 A1 | 5/2014 | Burak et al. |
| 2014/0118091 A1 | 5/2014 | Burak et al. |
| 2014/0118092 A1 | 5/2014 | Burak et al. |
| 2014/0159548 A1 | 6/2014 | Burak et al. |
| 2014/0224941 A1 | 8/2014 | Gitter et al. |
| 2014/0225682 A1 | 8/2014 | Burak et al. |
| 2014/0225683 A1 | 8/2014 | Burak et al. |

FOREIGN PATENT DOCUMENTS

| | | |
|---|---|---|
| DE | 10160617 | 6/2003 |
| DE | 10239317 | 3/2004 |
| DE | 102007012384 | 9/2008 |
| EP | 231892 | 8/1987 |
| EP | 0637875 | 2/1995 |
| EP | 689254 | 12/1995 |
| EP | 0865157 | 9/1998 |
| EP | 880227 | 12/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299592 | 3/2011 |
| EP | 2299593 | 3/2011 |
| FR | 2951027 | 4/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 359023612 | 2/1984 |
| JP | 60-16010 | 1/1985 |
| JP | 61054686 | 3/1986 |
| JP | 6165507 | 4/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 10-308645 | 11/1998 |
| JP | 2000-31552 | 1/2000 |
| JP | 2000076295 | 3/2000 |
| JP | 2000-232334 | 8/2000 |
| JP | 2000-295065 | 10/2000 |
| JP | 2000-514278 A | 10/2000 |
| JP | 2000-332568 | 11/2000 |
| JP | 2001-102901 | 4/2001 |
| JP | 2001-508630 | 6/2001 |
| JP | 2002-217676 | 8/2002 |
| JP | 2003017964 | 1/2003 |
| JP | 2003017974 | 1/2003 |
| JP | 2003-505905 | 2/2003 |
| JP | 2003124779 | 4/2003 |
| JP | 2003-332872 | 11/2003 |
| JP | 2005-159402 | 6/2005 |
| JP | 2006-109472 | 4/2006 |
| JP | 2006-295924 | 10/2006 |
| JP | 2006-319796 | 11/2006 |
| JP | 2007-006501 | 1/2007 |
| JP | 2007/028669 | 2/2007 |
| JP | 2007-295306 | 11/2007 |
| JP | 2008-066792 | 3/2008 |
| JP | 4471443 | 6/2010 |
| JP | 2003-505906 | 9/2013 |
| WO | 98/16957 | 4/1998 |
| WO | 98/38736 | 9/1998 |
| WO | 98/56049 | 12/1998 |
| WO | 99-37023 | 7/1999 |
| WO | 01/06646 | 1/2001 |
| WO | 01/06647 | 1/2001 |

(56) References Cited

FOREIGN PATENT DOCUMENTS

| WO | 0199276 | 12/2001 |
|---|---|---|
| WO | 02/103900 | 12/2002 |
| WO | 03/030358 | 4/2003 |
| WO | 03/043188 | 5/2003 |
| WO | 03/050950 | 6/2003 |
| WO | 03/058809 | 7/2003 |
| WO | 2004/034579 | 4/2004 |
| WO | 2004/051744 | 6/2004 |
| WO | 2004/102688 | 11/2004 |
| WO | 2005/043752 | 5/2005 |
| WO | 2005/043753 | 5/2005 |
| WO | 2005/043756 | 5/2005 |
| WO | 2006/018788 | 2/2006 |
| WO | 2006079353 | 8/2006 |
| WO | 2007085332 | 8/2007 |
| WO | 2013065488 | 5/2013 |

OTHER PUBLICATIONS

G.W. Archibald, "Experimental results of bulk acoustic wave transverse graded electrode patterns", Proceedings of the 1998 IEEE International Frequency Control Symposium, Publication Year: 1998, pp. 477-483.
Zou, et al. "High Coupling Coefficient Temperature Compensated FBAR Resonator for Oscillator Application with Wide Pulling Range", 2010 IEEE International Frequency Control Symposium (FCS), Jun. 1-4, 2010, pp. 646-651 and one page IEEE Xplore Abstract.
Zhang, et al. "MIMO Multiplexer Based on Film Bulk Acoustic Resonator"; IEEE Transactions on Consumer Electronics, vol. 56, No. 2, May 2010, pp. 805-810.
Final Office Action dated Aug. 10, 2015 in U.S. Appl. No. 13/766,993.
Machine Translation of WO02103900, published Dec. 27, 2002.
Machine Translation of WO03/030358, published Apr. 10, 2003.
Machine Translation of WO03/043188, published May 22, 2003.
Machine Translation of WO03/050950, published Jun. 19, 2003.
Machine Translation of CN101170303, published Sep. 14, 2011.
Machine Translation of DE10160617, published Jun. 12, 2003.
Machine Translation of DE102007012384, published Sep. 18, 2008.
Machine Translation of DE10239317, published Mar. 11, 2004.
Machine Translation of JP10308645, published Nov. 17, 1998.
Machine Translation of JP10-32456, published Feb. 3, 1998.
Machine Translation of JP2000076295, published Mar. 14, 2000.
Machine Translation of JP2000-232334, published Aug. 22, 2000.
Machine Translation of JP2000295065, published Oct. 20, 2000.
Machine Translation of JP2000-332568, published Nov. 30, 2000.
Machine Translation of JP2001-102901, published Apr. 13, 2001.
Machine Translation of JP2001-508630, published Jun. 26, 2001.
Machine Translation of JP20021217676, published Aug. 2, 2002.
Machine Translation of JP2003017964, published Jan. 17, 2003.
Machine Translation of JP2003124779, published Apr. 25, 2003.
Machine Translation of JP2003017974, published Jan. 17, 2003.
Machine Translation of JP2003-332872, published Nov. 21, 2003.
Machine Translation of JP2003-505905, published Feb. 12, 2003.
Examination Report dated Aug. 25, 2006 for UK Application No. GB0605770.7.
Examination Report dated Aug. 24, 2006 for UK Application No. GB0605971.1.
Search Report dated Dec. 13, 2006 for UK Application No. GB0617742.2.
Search Report dated Jun. 26, 2006 for UK Application No. GB0605225.2.
Search Report dated Nov. 15, 2006 for UK Application No. GB0620152.9.
Search Report dated Nov. 15, 2006 for UK Application No. GB0620655.1.
Search Report dated Nov. 17, 2006 for UK Application No. GB0620653.6.
Search Report dated Nov. 23, 2006 for UK Application No. GB0620657.7.
Search Report dated Aug. 23, 2006 for UK Application No. GB0605779.8.
Search Report dated Nov. 30, 2006 for UK Application No. GB0619698.4.
Auld, "Acoustic Resonators Acoustic Fields and Waves in Solids", Second Edition, vol. II, 250-259, 1990.
Bi, "Bulk Acoustic Wave RF Technology", IEEE Microwave Magazine, vol. 9, Issue 5. 65-80, 2008.
Chen, "Fabrication and Characterization of ALN Thin Film Bulk Acoustic Wave Resonator Dissertation", University of Pittsburgh School of Engineering, 2006.
Dubois, "Solidly Mounted Resonator Based on Aluminum Nitride Thin Film", 1998 IEEE Ultrasonics Symposium, vol. 1, 909-912, 1998.
El Hassan et al., "Techniques for Tuning BAW-SMR Resonators For The 4th Generation of Mobile Communications Intech", 421-442, 2013.
Kaitila et al., "Measurement of Acoustical Parameters of Thin Films", 2006 IEEE Ultrasonics Symposium, 464-467, Oct. 2006.
Kerherve, "BAW Technologies for Radiofrequency Filters and Duplexers", Nov. 2011.
Krishnaswamy et al., "Film Bulk Acoustic Wave Resonator Technology", 529-536, May 29, 1990.
Lakin, "Thin Film Resonators and Filters", IEEE Untrasonics Symposium, Caesar's Tahoe, NV, 895-906, Oct. 1999.
Larson et al., "Measurement of Effective Kt2,Q,Rp,Rs vs. Temperature for Mo/AlN FBAR Resonators", IEEE Ultrasonics Symposium, 939-943, 2002.
Lee et al., "Optimization of Frame-Like Film Bulk Acoustic Resonators for Suppression of Spurious Lateral Modes Using Finite Element Method", IEEE Ultrasonic Symposium, vol. 1, 278-281, 2004.
Pensala et al., "Spurious resonance supression in gigahertz-range ZnO thin-film bulk acoustic wave resonators by the boundary frame method: modeling and experiment", IEEE Transactions on Ultrasonics, Ferroelectrics, and Frequency Control, vol. 56, No. 8, 1731-1744, Aug. 2009.
Pensala, "Thin Film Bulk Acoustic Wave Devices: Performance Optimization and Modeling" VTT Publications 756, http://www.vtt.fi/inf/pdf/publications/2011/P756.pdf; dissertation presented Feb. 25, 2011, copyright VTT 2011, 1-108, Feb. 25, 2011.
Ruby et al., "The Effect of Perimeter Geometry on FBAR Resonator Electrical Performance", Microwave Symposium Digest, 2005, IEEE MTT-S International, 217-221, Jun. 12, 2005.
Sanchez et al., "Mixed Analytical and Numerical Design Method for Piezoelectric Transformers", IEEE Xplore, 841-846, 2003.
Strijbos, "Design and Characterisation of High-Q Solidly-Mounted Bulk Acoustic Wave Filters", ECTC '07 Proceedings, 57th Electronic Components and Technology Conference, Publication Year 2007, 169-174, 2007.
Tang et al., "Micromachined Bulk Acoustic Resonator With a Raised Frame", 16th International Conference on Mechatronics Technology, Tianjin, China, Oct. 16-19, 2012.
Machine Translation of JP2003-505906, published Sep. 30, 2013.
Machine Translation of JP2004/034579, published Apr. 22, 2004.
Machine Translation of WO2004/102688, published Nov. 25, 2004.
Machine Translation of JP2005-159402, published Jun. 16, 2005.
Machine Translation of WO2006079353, published Aug. 3, 2006.
Machine Translation of JP2006109472, published Apr. 20, 2006.
Machine Translation of JP2006295924, published Oct. 26, 2006.
Machine Translation of JP2006319796, published Nov. 24, 2006.
Machine Translation of JP2007/028669, published Feb. 1, 2007.
Machine Translation of JP2007-006501, published Jan. 11, 2007.
Machine Translation of WO2007085332, published Aug. 2, 2007.
Machine Translation of JP2007-295306, published Nov. 1, 2007.
Machine Translation of JP2008-066792, published Mar. 21, 2008.
Machine Translation of WO2013065488, published May 10, 2013.
Machine Translation of JP2-10907, published Jan. 16, 1990.
Machine Translation of FR2951027, published Apr. 8, 2011.

(56) References Cited

OTHER PUBLICATIONS

Machine Translation of JP4471443, published Jun. 2, 2010.
Machine Translation of WO98/38736, published Sep. 3, 1998.
Machine Translation of WO99-37023, published Jul. 22, 1999.
Search Report dated Jan. 9, 2006 for UK Application No. GB0522393.8, 4 pages.
Search Report dated Feb. 2, 2006 for UK Application No. GB0525884.3, 4 pages.
Search Report dated Jul. 11, 2006 for UK Application No. GB0605222.9.
Tiersten et al., "An Analysis of Thickness-Extensional Trapped Energy Resonant Device Structures with Rectangular Electrodes in the Piezoelectric Thin Film on Silicon Configuration", J. Appl. Phys., 54, (10), 5893-5910, Oct. 1983.
Chinese Office Action dated Jun. 3, 2016 with translation.

* cited by examiner

ACCOUSTIC RESONATOR HAVING COMPOSITE ELECTRODES WITH INTEGRATED LATERAL FEATURES

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. For example, BAW resonators include thin film bulk acoustic resonators (FBARs), which may be used for electrical filters and voltage transformers. Generally, an acoustic resonator has a layer of piezoelectric material between two conductive plates (electrodes), which may form a thin membrane.

FBAR devices, in particular, generate longitudinal acoustic waves and lateral acoustic waves when stimulated by an applied time-varying electric field, as well as higher order harmonic mixing products. The longitudinal acoustic wave, usually called a piston mode, is electrically excited by a vertical electric field between electrode plates and has a form of laterally uniform motion with the boundaries of motion determined by an overlap of top and bottom electrodes and the piezoelectric material. Lateral acoustic waves, usually called lateral modes, are excited at the edges of the piston mode motion and facilitate continuity of appropriate mechanical displacements and stresses between electrically excited and non-excited regions. In general, lateral modes are specific forms of motion supported by a mechanical stack and have both longitudinal and shear components. The lateral modes can either propagate freely (so called propagating modes) or exponentially decay (so called evanescent and complex modes) from the point of excitation. These modes can be excited both by a lateral mechanical discontinuity (for example, at an interface between a frame and a membrane, or at the edge of a top or bottom electrode) or by electrical discontinuity (for example, at an edge of a top electrode where the electric field is terminated abruptly). The lateral modes and the higher order harmonic mixing products generally have a deleterious impact on functionality.

In certain configurations, a frame may be provided along one or more sides of an FBAR to mitigate acoustic losses at the boundaries by minimizing scattering of electrically excited piston mode at the top electrode edges and by improving confinement of mechanical motion to the active region of the FBAR (the region of overlap of the top electrode, the piezoelectric layer, and the bottom electrode). In general, frames are made of added (or removed) thin layers of material along the perimeter of the resonator device with the purpose of lowering (increasing) the cutoff frequency in that region with respect to the main membrane. This in turn minimizes the amplitude of the electrically excited piston mode and the resulting scattering at top electrode edges above (or below) the cut-off frequency of a membrane. Frames also create an acoustic impedance mismatch that enables suppression of the amplitudes of propagating and/or evanescent modes (whichever exist in the frequency range of interest) mechanically excited at the membrane/frame boundary, thus further minimizing acoustic energy leakage to the outside of the active region. However, in addition to improved acoustic energy confinement, as well as further improvements in FBAR quality factor Q due to the better acoustic energy confinement, simplified design and implementation of frames are needed. In particular, in some applications, frames placed above the piezoelectric layer are not effective in suppressing modes confined to the bottom part of the stack. Thus, approaches allowing for construction of planarized frames below piezoelectric layers that would facilitate growth of good-quality planar layers above the frame regions are needed.

SUMMARY

In a representative embodiment, a bulk acoustic wave (BAW) resonator device includes a bottom electrode on a substrate over one of a cavity and an acoustic reflector, a piezoelectric layer on the bottom electrode, and a top electrode on the piezoelectric layer. At least one of the bottom electrode and the top electrode includes a composite electrode having an integrated lateral feature, arranged between planar top and bottom surfaces of the composite electrode and configured to create at least one of a cut-off frequency mismatch and an acoustic impedance mismatch.

In another representative embodiment, a thin film bulk acoustic resonator (FBAR) includes a bottom electrode on a substrate, a piezoelectric layer on the first electrode, and a top electrode on the piezoelectric layer. At least one of the bottom and the top electrode is formed of a first material and a second material, where the first material has a lower sound velocity than the second material. The FBAR further includes one of an integrated low velocity frame formed by the first material or an integrated high velocity frame formed by the second material within at least one of the bottom and the top electrode at an outer region of the FBAR.

In another representative embodiment, a BAW resonator device includes a bottom electrode formed on a substrate over one of a cavity and an acoustic reflector, a piezoelectric layer formed on the bottom electrode, and a composite top electrode formed on the piezoelectric layer, the composite top electrode comprising an integrated low velocity frame formed substantially around an outer perimeter of the composite top electrode, the integrated low velocity frame having a thickness less than a total thickness of the composite top electrode. The integrated low velocity frame is formed of a first material and a remainder of the composite top electrode is formed of a second material, the first material having a lower sound velocity than the second material.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
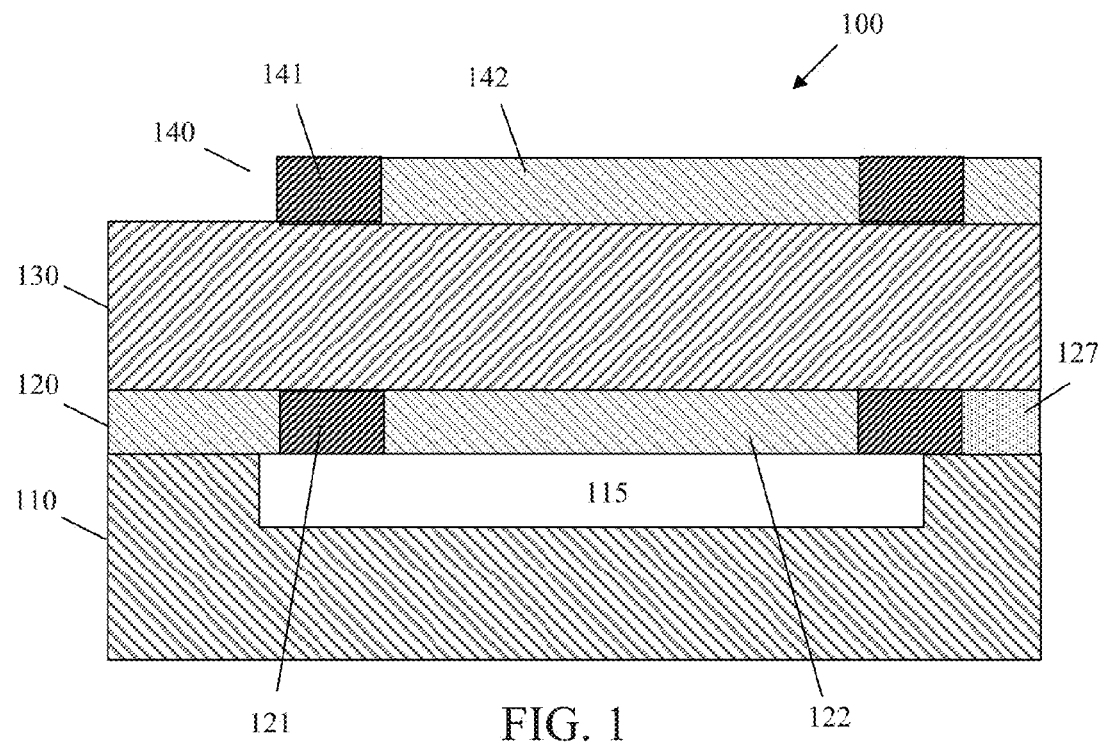
FIG. 1 is a cross-sectional diagram illustrating an acoustic resonator, including composite electrodes and integrated frames, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Further, as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present teachings are directed to integrated lateral features, such as integrated low velocity and high velocity frames, that are included within one or more composite electrodes of a BAW resonator, such as an FBAR. The integrated lateral features generally suppress electrically excited piston mode in the region defined by the feature, and reflect and otherwise resonantly suppress propagating eigenmodes in lateral directions, with both effects simultaneously improving operation of the BAW resonator. Introduction of integrated lateral features generally results in creating at least one of a cut-off frequency mismatch and an acoustic impedance mismatch. The composite electrodes are formed of at least two different conductive materials, such as metals, having different sound velocities and acoustic impedances. The term "integrated" means that the lateral feature is formed within a corresponding composite electrode, as opposed to being formed on or otherwise protruding from one of the surfaces of the composite electrode, such that the composite electrode maintains substantially planar top and bottom surfaces that are substantially parallel to one another. This simplifies fabrication of the FBAR with regard to application of layers on planar surfaces, yet provides the benefits of the lateral features.

For example, an integrated low velocity frame may be located along the outer edges of an FBAR, which generally increases parallel resistance Rp and quality factor Q above the cut-off frequency. Similarly, an integrated high velocity frame may be located along the outer edges of an FBAR, which generally decreases series resistance Rs and increases quality factor Q below the cut-off frequency. A typical integrated low velocity frame, for example, effectively provides a region with significantly lower cut-off frequency than the main membrane and therefore minimizes the amplitude of the electrically excited piston mode towards the edge of the top electrode in the frame region. Furthermore, it provides two interfaces (impedance miss-match planes), which increase reflection of (mechanically excited at membrane/frame interface) propagating eigenmodes in lateral directions. When the width of the frame is properly designed for a given eigenmode, it results in resonantly enhanced suppression of that particular eigenmode. Lastly, a sufficiently wide integrated low velocity frame provides a region for smooth decay of the evanescent and complex modes mechanically excited at the membrane/frame interface. The combination of these three effects yields better energy confinement and higher quality factor Q at parallel resonance frequency Fp.

Certain aspects of the present teachings build upon components of FBAR devices, FBAR-based filters, their materials and methods of fabrication. Many details of FBARs, materials thereof and their methods of fabrication may be found in one or more of the following U.S. patents and patent applications: U.S. Pat. No. 6,107,721 (Aug. 22, 2000) to Lakin; U.S. Pat. No. 5,587,620 (Dec. 24, 1996), U.S. Pat. No. 5,873,153 (Feb. 23, 1999) U.S. Pat. No. 6,507,983 (Jan. 21, 2003) and U.S. Pat. No. 7,388,454 (Jun. 17, 2008) to Ruby, et al.; U.S. Pat. No. 7,629,865 (Dec. 8, 2009) to Ruby; U.S. Pat. No. 7,714,684 (May 11, 2010) to Ruby et al.; U.S. Pat. No. 7,280,007 (Oct. 9, 2007) to Feng et al.; U.S. Pat. App. Pub. No. 2007/0205850, entitled "Piezoelectric Resonator Structures and Electrical Filters having Frame Elements" to Jamneala et al.; U.S. Pat. App. Pub. No. 2010/0327697, entitled "Acoustic Resonator Structure Comprising a Bridge" to Choy et al.; U.S. Pat. App. Pub. No. 2010/0327994, entitled "Acoustic Resonator Structure having an Electrode with a Cantilevered Portion" to Choy et al.; and U.S. patent application Ser. No. 13/036,489, entitled "Coupled Resonator Filter Comprising a Bridge" to Burak filed on Feb. 28, 2011. The disclosures of these patents and patent applications are hereby incorporated by reference. It is emphasized that the components, materials and method of fabrication described in these patents and patent applications are representative and other methods of fabrication and materials within the purview of one of ordinary skill in the art are contemplated.

Figure 2:
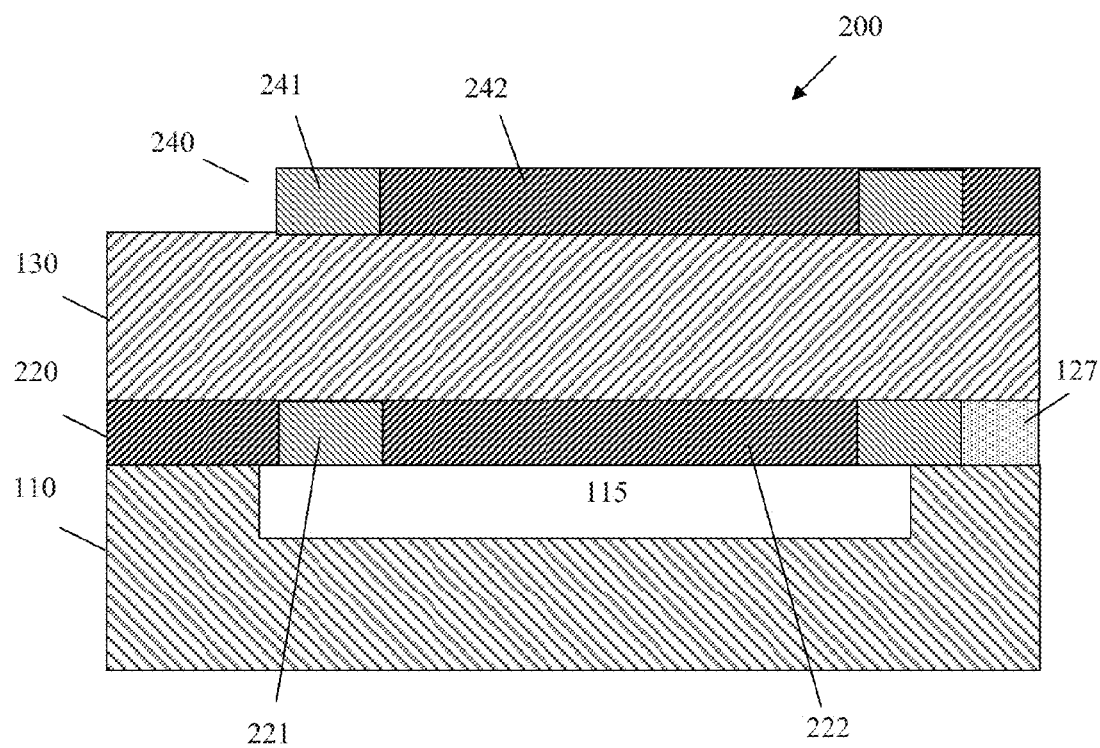
FIG. 2 is a cross-sectional diagram illustrating an acoustic resonator, including composite electrodes and integrated frames, a according to representative embodiment.
Figure 3:
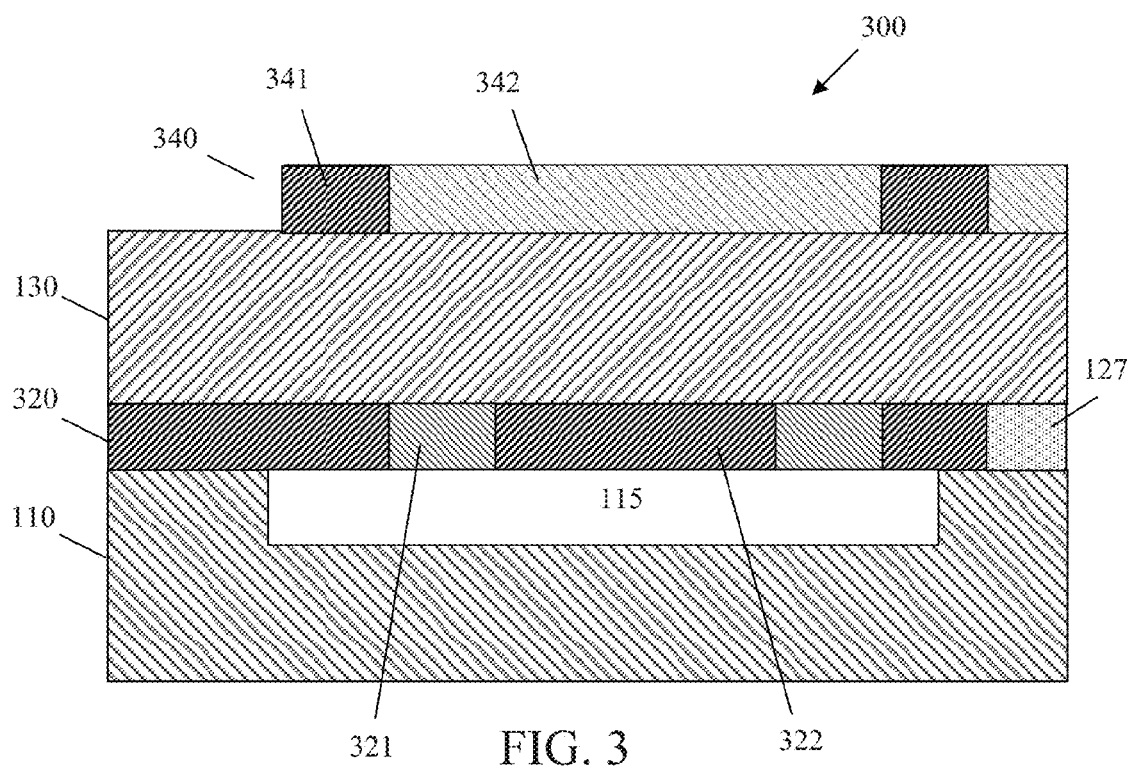
FIG. 3 is a cross-sectional diagram illustrating an acoustic resonator, including composite electrodes and integrated frames, according to representative embodiments.

In various embodiments, a BAW resonator, such as an FBAR, includes one or more composite electrodes having a single layer containing different materials formed at the same level. For example, FIGS. 1 to 3 are cross-sectional diagrams illustrating acoustic resonators, including composite electrodes and integrated frames, in which each composite electrode includes different conductive materials at one level, segregated from one another in the horizontal direction (in the orientations depicted in FIGS. 1 to 3). The integrated frame is implemented by the conductive materials having, in general, different sound velocities and acoustic impedances from one another.

FIG. 1 is a cross-sectional diagram illustrating an acoustic resonator, according to a representative embodiment. In the example depicted in FIG. 1 (as well as the examples depicted in FIGS. 2-7, discussed below), the acoustic resonator is an FBAR, for convenience of explanation. However, it is understood that other types of acoustic resonators may be included, without departing from the scope of the present teachings.

Referring to FIG. 1, FBAR 100 includes a resonator stack comprising multiple layers stacked over substrate 110 having a cavity 115 for reflection of acoustic waves. In various alternative configurations, a known acoustic reflector, such as a Bragg mirror (not shown) comprising alternating layers of high and low acoustic impedance may be provided in the substrate 110 to provide acoustic isolation, in place of the cavity 115, without departing from the scope of the present teachings. The substrate 110 may be formed of a material compatible with semiconductor processes, such as silicon (Si), gallium arsenide (GaAs), indium phosphide (InP), glass, sapphire, alumina, or the like, for example. Various illustrative fabrication techniques of cavities in a substrate are described by U.S. Pat. No. 7,345,410 (Mar. 18, 2008) to Grannen et al., and various illustrative fabrication techniques of acoustic mirrors are described by in U.S. Pat. No. 7,358,831 (Apr. 15, 2008), to Larson III, et al., which are hereby incorporated by reference in their entireties.

The FBAR 100 further includes piezoelectric layer 130 sandwiched between two composite electrodes: A first or bottom electrode 120 and second or top electrode 140. The bottom electrode 120 is disposed over the substrate 110 and the cavity 115. A planarization layer 127 is also provided over the substrate 110 as shown in order to provide a planar top surface of the bottom electrode 120. In a representative embodiment, the planarization layer 127 includes non-etchable borosilicate glass (NEBSG), for example. In general, the planarization layer 127 does not need to be present in the structure (as it increases overall processing cost), but when present, it may improve quality of growth of subsequent layers and simplify their processing. The piezoelectric layer 130 is disposed over the bottom electrode 120, and the top electrode 140 is disposed over the piezoelectric layer 130. Together, the bottom electrode 120, the piezoelectric layer 130 and the top electrode 140 form the (thin) membrane of the FBAR 100.

As mentioned above, each of the bottom and top electrodes 120 and 140 are composite electrodes formed of multiple conductive materials. A composite electrode may be a bi-metal electrode, for example, formed of two electrically conductive metal materials, such as tungsten (W), molybdenum (Mo) or copper (Cu). Alternatively, a composite electrode may include one or more dielectric materials, such as silicon dioxide ($SiO_2$), silicon nitride (SiN), silicon carbide (SiC), aluminum nitride (AlN), zinc oxide (ZnO) or lead zirconium titanate (PZT), for example, in place of one of the metal materials. The piezoelectric layer 130 is formed of a thin film of piezoelectric material, such as ZnO, AlN or PZT, for example. However, other materials may be incorporated in the FBAR 100 without departing from the scope of the present teachings. In various embodiments, the bottom and top electrodes 120 and 140 may be formed of the same or different materials from one another.

The FBAR 100 further includes integrated lateral features configured to minimize scattering of piston mode at the top electrode 140 edge at frequencies above the cut-off frequency of the membrane by three mechanisms described above: (1) minimization of piston mode amplitude excited by time-harmonic electric field in the integrated lateral feature region, (2) suppression of at least a portion of the thickness extensional (TE), thickness shear (TS) and flexural propagating lateral acoustic modes, and (3) facilitation of exponential decay of evanescent and higher-order complex TE modes. According to the depicted representative embodiment, the lateral features include integrated low velocity frame 121 surrounding inner portion 122 in the bottom electrode 120, and integrated low velocity frame 141 surrounding inner portion 142 in top electrode 140. In the bottom electrode 120, the integrated low velocity frame 121 is formed of a first material and the inner portion 122 is formed of a second material different from the first material, where the first material has lower sound velocity than the second material. Likewise, in the top electrode 140, the integrated low velocity frame 141 is also formed of the first material and the inner portion 142 is formed of the second material. For example, the integrated low velocity frames 121 and 141 may be formed of W and the inner portions 122 and 142 may be formed of Mo, although other materials may be incorporated without departing from the scope of the present teachings.

Generally, the integrated low velocity frames 121 and 141 present a substantial down-shift of cut-off frequency yielding substantially lower amplitude of electrically excited piston mode at the pass-band frequencies (above the series resonance frequency). Also, integrated low velocity frames 121 and 141 provide large acoustic impedance discontinuities to both propagating and evanescent modes mechanically excited at interfaces between integrated bottom and top low velocity frames 121 and 141 and bottom and top inner portions 122 and 142. Beneficially, impact of this discontinuity on the acoustic waves can be minimized by proper selection of integrated low velocity frame width, thus suppressing the propagating eigen-modes and exponentially decaying the evanescent and complex eigen-modes. As a result, total acoustic energy density at the edge of the top electrode 140 is minimized, which beneficially yields minimized scattering of acoustic energy and increased parallel resistance Rp and quality factor Q of the FBAR 100.

In the depicted embodiment, the integrated low velocity frame 121 is co-planar with the inner portion 122, meaning that both the integrated low velocity frame 121 and the inner portion 122 have substantially the same thickness (in the vertical direction according to the orientation shown in FIG. 1) within the bottom electrode 120. Stated differently, the integrated low velocity frame 121 may form a ring of equal thickness around the inner portion 122. The integrated low velocity frame 121 is generally located in an outer region of the FBAR 100, and may be formed around all or part of a perimeter of the bottom electrode 120. For example, the FBAR 100 (as well as the other FBARs discussed below) may be apodized or irregular in shape from a top perspective (not shown), and the integrated low velocity frame 121 may substantially follow along an outer perimeter of the bottom electrode 120. That is, the bottom electrode 120 may have five sides arranged in a substantially trapezoidal shape, for example, in which case the integrated low velocity frame 121 may be formed along all five sides, or fewer than all five sides of the FBAR 100.

Similarly, the integrated low velocity frame 141 is coplanar with the inner portion 142 of the top electrode 140, meaning that both the integrated low velocity frame 141 and the inner portion 142 have substantially the same thickness. That is, the integrated low velocity frame 141 may form a ring of equal thickness around the inner portion 142. The integrated low velocity frame 141 is located in the outer region of the FBAR 100, which may be apodized or irregular in shape, as discussed above, and may be formed around all or part of a perimeter of the top electrode 140. In general, an active region of the FBAR 100 is defined by overlap between the top electrode 140, the piezoelectric layer 130 and the bottom electrode 120. However, since both the bottom and top low velocity frames 121 and 141 facilitate significant down shift of cut-off frequency, an effective active region of the FBAR 100 in the pass-band frequency range is determined by overlap of the bottom and top inner portions 122 and 142, and the piezoelectric layer 130. Of course, the FBAR 100 may be formed in various alternative shapes, such as circular, square, rectangular, trapezoidal, etc., without departing from the scope of the present teachings. Also, in various embodiments, the integrated low velocity frames 121 and 141 may be shaped differently from the shape of the FBAR 100 and/or the integrated low velocity frames 121 and 141 may not be disposed along all of the edges of the bottom and top electrodes 120 and 140, respectively.

The outer region of the FBAR 100 generally includes portions of the FBAR 100 at and/or near an outer perimeter of bottom and top electrodes 120 and 140. The outer region may extend toward (but not include) a central region of the FBAR 100 by various amounts, depending on application specific design requirements of various implementations, for example. The central region generally includes a portion of each of the bottom and top electrodes 120 and 140 that incorporates the center of the active region of the FBAR 100. In FIG. 1, the inner portions 122 and 142 of the bottom and top electrodes 120 and 140 incorporate the central region of the FBAR 100.

Illustratively, each of the bottom electrode 120 and the top electrode 140 may be formed of W and Mo, as mentioned above, and have a thickness (vertical direction in the orientation depicted in FIG. 1) of approximately 1000 Å to approximately 20000 Å. In various embodiments, the bottom and top electrodes 120 and 140 may have the same or different thicknesses from one another. Because the integrated low velocity frames 121 and 141 are the same thicknesses as the bottom and top electrodes 120 and 140, respectively, these thicknesses may be varied only by varying the total thicknesses of the bottom and top electrodes 120 and 140. Each of the integrated low velocity frames 121 and 141 may have a width (horizontal direction in the orientation depicted in FIG. 1) of approximately 0.1 µm to approximately 10 µm, for example. In various embodiments, the integrated low velocity frames 121 and 141 may have the same or different widths from one another. The piezoelectric layer 130 may be formed of AlN and have a thickness of approximately 5000 Å to approximately 25000 Å, for example.

The respective dimensions of the bottom and top electrodes 120 and 140, and the integrated low velocity frames 121 and 141 (as well as the dimensions of the piezoelectric layer 130), may be varied to provide unique benefits for any particular situation or to meet application specific design requirements of various implementations. Accordingly, when designed properly for maximum piston mode and eigenmode suppression at the edges of bottom and top electrodes 120 and 140, the integrated low velocity frames 121 and 141 improve the energy confinement inside the FBAR 100, which manifests itself by increased parallel resistance Rp and quality factor Q of the FBAR 100.

Generally, each of the bottom electrode 120 and the top electrode 140 may be formed using the same or similar techniques. For example, the integrated low velocity frame 121 may be formed by applying a layer of the first material to a top surface of the substrate 110 and the cavity 115 (before releasing sacrificial material initially filling the cavity 115) using a spin-on, sputtering, evaporation or chemical vapor disposition (CVD) technique, for example, to the desired thickness. Then dry etch is used to define a desired pattern of the first material forming the low velocity frame 121. A thin metal-etch stop layer (300 Å of AlN, for example) (not shown) is deposited over the substrate 110, the cavity 115 and the integrated low velocity frame 121. The second material is deposited to a top surface of the substrate 110, the cavity 115, and the low velocity frame 121 and over the metal-etch stop layer using a spin-on, sputtering, evaporation or CVD technique, for example, to the desired thickness. The second material is then etched from the substrate 110 and from the low velocity frame 121, following application of a photoresist pattern (e.g., via photolithography), using sulfur hexafluoride (SF6)-based plasma etch, for example, forming the desired pattern of the bottom electrode 120. Finally, Chemical-Mechanical Planarization (CMP) using aluminum oxide abrasive, for example, is performed to obtain a desired substantially planar bottom electrode 120. A process to construct the integrated low velocity frame 141 is essentially the same as the process to construct the integrated low velocity frame 121. Of course, various other techniques may be incorporated to form the bottom and top electrodes 120 and 140, as would be apparent to one of ordinary skill in the art.

In alternative configurations, the FBAR 100 may include only one composite electrode (bottom electrode 120 or top electrode 140) having an integrated low velocity frame (integrated low velocity frame 121 or integrated low velocity frame 141), without departing from the scope of the present teachings. When only one of the electrodes includes an integrated low velocity frame, the other electrode may be formed of a single material, or may also be a composite electrode, but with no integrated low velocity frame. For example, in a variation of the FBAR 100, the top electrode 140 may include integrated low velocity frame 141 and inner portion 142, as discussed above, while the bottom electrode 120 has no integrated low velocity frame. In this case, the bottom electrode 120 may still include two materials, applied in consecutive layers (e.g., the first material stacked on the second material) with no lateral features, or the bottom electrode 120 may be formed of a single material (e.g., the first material or the second material). Similarly, the bottom electrode 120 may include integrated low velocity frame 121 and inner portion 122, as discussed above, while the top electrode 140 has no integrated low velocity frame. Such approaches may be beneficial, as they would enable fine-tuning of the strength of the integrated low velocity frame 121, 141 deposited in the other electrode to facilitate specific device design needs.

As should be appreciated by one of ordinary skill in the art, the structure provided by the bottom electrode 120, the piezoelectric layer 130 and the top electrode 140 is a BAW resonator. When the BAW resonator is disposed over a cavity (e.g., the cavity 115), it is a so-called FBAR (e.g., FBAR 100), and when the BAW resonator is disposed over an acoustic reflector (e.g., Bragg mirror), it is a so-called solidly mounted resonator (SMR). The present teachings contemplate the use of either FBARs or SMRs in a variety of applications, including filters (e.g., ladder filters comprising a plurality of BAW resonators). However, the effects related to minimization of piston mode scattering at the edge of the top electrode 140 with the integrated low velocity frames 121 and 141 on parallel resistance Rp and on series resistance Rs of the FBAR 100 (as well as the other FBARs discussed herein) are generally the same as the effects on parallel resistance Rp and series resistance Rs of an SMR supporting a similar set of modes as the FBAR 100, as would be appreciated by one of ordinary skill in the art.

FIG. 2 is a cross-sectional diagram illustrating an acoustic resonator, including composite electrodes and integrated frames, according to a representative embodiment.

Referring to FIG. 2, FBAR 200 includes a resonator stack comprising multiple layers stacked over substrate 110 having a cavity 115 for reflection of acoustic waves. The FBAR 200 further includes piezoelectric layer 130 sandwiched between two composite electrodes: A first or bottom electrode 220 and second or top electrode 240. In various embodiments, the bottom and top electrodes 220 and 240 may be formed of the same or different materials from one another. The substrate 110, the cavity 115, the piezoelectric layer 130 and the planarization layer 127 are substantially the same as discussed above with reference to FIG. 1, and therefore the description will not be repeated.

The FBAR 200 further includes integrated lateral features configured to minimize scattering of piston mode at the edge of the top electrode 240 at frequencies below the cut-off frequency of the membrane by the three mechanisms described above: (1) minimization of piston mode amplitude excited by time-harmonic electric field, (2) suppression of at least a portion of mechanically excited at a membrane/frame interface TE lateral acoustic mode with the negative group velocity dispersion (that is the mode which group velocity decreases with increasing frequency), and (3) facilitation of exponential decay of higher-order complex TE modes mechanically excited at a membrane/frame interface. The FBAR 200 further includes integrated high velocity frame 221 surrounding inner portion 222 in the bottom electrode 220, and integrated high velocity frame 241 surrounding inner portion 242 in top electrode 240. The integrated high velocity frames 221 and 241 are formed of the second material and the inner portions 222 and 242 are formed of the first material, where the second material has higher sound velocity than the first material. For example, the integrated high velocity frames 221 and 241 may be formed of Mo and the inner portions 222 and 242 may be formed of W, although other materials may be incorporated without departing from the scope of the present teachings.

In the depicted embodiment, the integrated high velocity frames 221 and 241 are co-planar with the inner portions 222 and 242, respectively, meaning that they have substantially the same layer thickness within the bottom electrode 220 and the top electrode 240. Stated differently, the integrated high velocity frame 221 may form a ring of equal thickness around the inner portion 222 in the bottom electrode 220, and the integrated high velocity frame 241 may form a ring of equal thickness around the inner portion 242 in the top electrode 240. Each the integrated high velocity frames 221 and 241 is generally located in an outer region of the FBAR 200, and may be formed around all or part of a perimeter of the bottom and top electrodes 220 and 240, respectively. Meanwhile, each the inner portions 222 and 242 is generally located in a central region of the FBAR 200. The central and outer regions are the same as discussed above with regard to FBAR 100, for example.

The FBAR 200 may be apodized or irregular in shape from a top perspective (not shown), and integrated high velocity frames 221 and 241 may substantially follow along an outer perimeter of the bottom and top electrodes 220 and 240, respectively, as discussed above with reference to FBAR 100. An active region of the FBAR 200 is defined by overlap between the top electrode 240, the piezoelectric layer 130 and the bottom electrode 220. However, since both the bottom and top integrated high velocity frames 221 and 241 facilitate significant up-shift of cut-off frequency, an effective active region of FBAR 200 in the pass-band frequency range is defined by overlap of the bottom and top inner portions 222 and 242, and the piezoelectric layer 130. Of course, the FBAR 200 may be formed in alternative shapes, such as circular, square, rectangular, trapezoidal, etc., without departing from the scope of the present teachings. Also, in various embodiments, the integrated high velocity frames 221 and 241 may be shaped differently from the shape of the FBAR 200.

Illustratively, each of the bottom electrode 220 and the top electrode 240 may be formed of W and Mo, as mentioned above, and have a thickness of approximately 1000 Å to approximately 20000 Å. In various embodiments, the bottom and top electrodes 220 and 240, and thus the integrated high velocity frames 221 and 241, may have the same or different thicknesses from one another. Each of the integrated high velocity frames 221 and 241 may have a width of approximately 0.1 μm to approximately 10 μm, for example. In various embodiments, the integrated high velocity frames 221 and 241 may have the same or different widths from one another. The respective dimensions of the bottom and top electrodes 220 and 240, and the integrated high velocity frames 221 and 241, may vary to provide unique benefits for any particular situation or to meet application specific design requirements of various implementations.

Generally, each of the bottom electrode 220 and the top electrode 240 may be formed using similar or the same techniques. For example, the bottom integrated high velocity frame 221 may be formed by applying a layer of the second material to a top surface of the substrate 110 and the cavity 115 (before releasing sacrificial material initially filling the cavity 115) using a spin-on, sputtering, evaporation or CVD technique, for example, to the desired thickness. Then, dry etch is used to define a desired pattern of the second material forming the high velocity frame 221. A thin metal-etch stop layer (300 Å of AlN, for example) (not shown) is deposited over the substrate 110, the cavity 115, and the integrated high velocity frame 221. Then the first material is deposited to a top surface of the substrate 110, the cavity 115, and the high velocity frame 221 and over the metal-etch stop layer using a spin-on, sputtering, evaporation or CVD technique, for example, to the desired thickness. The first material is then etched from the substrate 110 and from the high velocity frame 221, following application of a photoresist pattern (e.g., via photolithography), using sulfur hexafluoride (SF6)-based plasma etch, for example, forming the desired bottom electrode 220 pattern. Finally, CMP using aluminum oxide abrasive, for example, is performed to obtain a desired substantially planar bottom electrode 220. A process to construct the integrated high velocity frame 241 is essentially the same as the process to construct the integrated high velocity frame 221. Of course, various other techniques may be incorporated to form the bottom and top electrodes 220 and 240, as would be apparent to one of ordinary skill in the art.

As mentioned above with reference to FIG. 1, in alternative configurations, the FBAR 200 may include only one composite electrode (bottom electrode 220 or top electrode 240) having an integrated high velocity frame (integrated high velocity frame 221 or integrated high velocity frame 241), without departing from the scope of the present teachings. When only one of the electrodes includes an integrated high velocity frame, the other electrode may be formed of a single material or may also be a composite electrode (without a lateral feature or with a different type of lateral feature).

In various embodiments, FBARs may include different types of lateral features in different electrodes. For example, FIG. 3 is a cross-sectional diagram illustrating an acoustic resonator, including composite electrodes and integrated frames, according to a representative embodiment, in which an integrated high velocity frame is included in the bottom composite electrode and an integrated low velocity frame is included in the top electrode. Of course, the arrangement may be reversed, such that an integrated low velocity frame is included in the bottom composite electrode and an integrated high velocity frame is included in the top electrode, without departing from the scope of the present teachings.

More particularly, referring to FIG. 3, FBAR 300 includes a resonator stack comprising multiple layers stacked over substrate 110 having a cavity 115 for reflection of acoustic waves. The FBAR 300 further includes piezoelectric layer 130 sandwiched between two composite electrodes: A first or bottom electrode 320 and second or top electrode 340. In various embodiments, the bottom and top electrodes 320 and 340 may be formed of the same or different materials from one another. The substrate 110, the cavity 115, the piezoelectric layer 130 and the planarization layer 127 are substantially the same as discussed above with reference to FIG. 1.

The FBAR 300 further includes integrated high-velocity frame 321 surrounding inner portion 322 in the bottom electrode 320, and integrated low velocity frame 341 surrounding inner portion 342 in top electrode 340. The integrated low velocity frame 341 and the inner portion 322 are formed of the first material and the integrated high velocity frame 321 and the inner portion 342 are formed of the second material, where the first material has lower sound velocity than the second material, as discussed above. For example, the integrated high velocity frame 321 and the inner portion 342 may be formed of Mo, and the integrated low velocity frame 341 and the inner portion 322 may be formed of W, although other materials may be incorporated without departing from the scope of the present teachings.

In the depicted embodiment, the integrated high velocity and low velocity frames 321 and 341 are co-planar with the inner portions 322 and 342, respectively, meaning that they have substantially the same thickness within the bottom electrode 320 and the top electrode 340. Stated differently, the integrated high velocity and low velocity frames 321 and 341 may form rings of equal thickness around the inner portions 322 and 342 in the bottom and top electrodes 320 and 340, respectively. As discussed above, the integrated high velocity and low velocity frames 321 and 341 in an outer region of the FBAR 300, while the inner portions 322 and 342 are generally located in an inner region of the FBAR 300.

In the depicted embodiment, the inner edge of integrated low velocity frame 341 is vertically aligned with the outer edge of integrated high velocity frame 321. Such vertical alignment facilitates sharp transition between a region of lower cut-off frequency in the integrated low velocity frame 341 and higher cut-off frequency in the integrated high velocity frame 321. Thus the performance of the FBAR 300 is expected to be improved both in the spectral region below and above cut-off frequency of a main membrane. However, in some applications it may be beneficial to misalign the integrated low velocity and high velocity frames 341 and 321. Such misalignment may minimize overlaps between propagating modes in various regions for the FBAR 300, thus further minimizing acoustic energy density at the edge of the top electrode 340 and therefore improving quality factor Q across the whole passband.

Illustratively, each of the bottom electrode 320 and the top electrode 340 may be formed of W and Mo, as mentioned above, and have a thickness of approximately 1000 Å to approximately 20000 Å. In various embodiments, the bottom and top electrodes 320 and 340, and thus the integrated high velocity frame 321 and the integrated low velocity frame 341, may have the same or different thicknesses from one another. The integrated low velocity frame 341 may have a width (horizontal direction in the orientation depicted in FIG. 3) of approximately 0.1 μm to 10 μm, for example. The integrated high velocity frame 321 may have a width of approximately 0.1 μm to approximately 10 μm, for example. The respective dimensions of the bottom and top electrodes 320 and 340, and the integrated high velocity and low velocity frames 321 and 341, may vary to provide unique benefits for any particular situation or to meet application specific design requirements of various implementations.

In various embodiments, a BAW resonator, such as an FBAR, for example, includes one or more composite electrodes having multiple electrode layers formed of different materials. For example, FIGS. 4 to 7 are cross-sectional diagrams illustrating acoustic resonators, including composite electrodes and integrated frames, in which each composite electrode has a multilayer portion comprising at least two electrode layers of different conductive materials stacked in the vertical direction (in the illustrative orientations depicted in FIGS. 4 to 7). For purposes of discussion, the electrode layer adjacent the piezoelectric layer may be referred to as an inside electrode layer, and the electrode layer adjacent the inside electrode layer may be referred to as an outside electrode layer (where at least a portion of the outside electrode layer is separated from the piezoelectric layer by the inside electrode layer). The integrated frame may be implemented by the conductive material having the higher or lower sound velocity.

Figure 4:
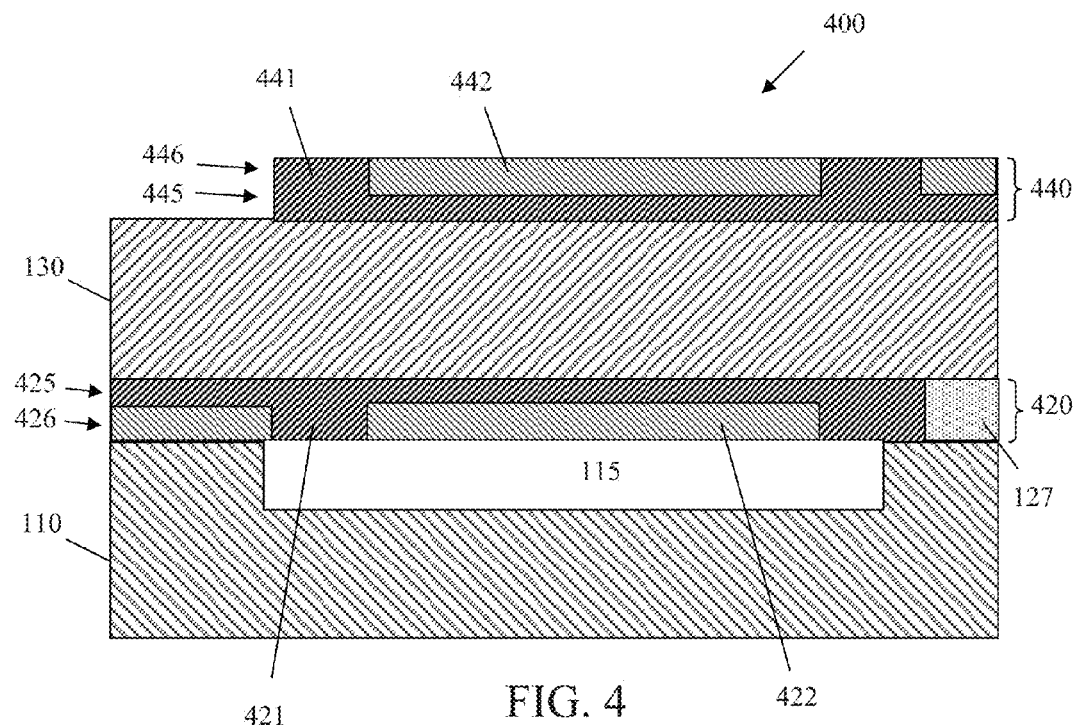
FIG. 4 is a cross-sectional diagram illustrating an acoustic resonator, including composite electrodes having multiple layers and integrated frames, according to a representative embodiment.

More particularly, FIG. 4 is a cross-sectional diagram illustrating an acoustic resonator, including composite electrodes having multiple layers and integrated frames, according to a representative embodiment. Referring to FIG. 4, FBAR 400 includes a resonator stack comprising multiple layers stacked over substrate 110 having a cavity 115 for reflection of acoustic waves. The FBAR 400 further includes piezoelectric layer 130 sandwiched between two composite electrodes: A first or bottom electrode 420 and second or top electrode 440. In various embodiments, the bottom and top electrodes 420 and 440 may be formed of the same or different materials from one another. The substrate 110, the cavity 115, the piezoelectric layer 130 and the planarization layer 127 are substantially the same as discussed above with reference to FIG. 1.

In the depicted embodiment, the composite bottom electrode 420 has multiple electrode layers, including an inside electrode layer 425 formed adjacent to the piezoelectric layer 130 and an outside electrode layer 426 formed adjacent the inside electrode layer 425. The inside electrode layer 425 is formed of the first material and the outside electrode layer 426 is formed of the first and second materials, where the first material has a lower sound velocity than the second material. Because the bottom electrode 420 is formed beneath the piezoelectric layer 130 in the orientation depicted in FIG. 4, the outside electrode layer 426 is formed first on the substrate 110, and the inside electrode layer 425 is then formed on the outside electrode layer 426 to provide the bottom electrode 420. The piezoelectric layer 130 is then formed on the inside electrode layer 425. For example, the integrated low velocity frame 421 may be formed by applying a layer of the first material to a top surface of the substrate 110 and the cavity 115 (before releasing sacrificial material initially filling the cavity 115) using a spin-on, sputtering, evaporation or CVD technique, for example, to the desired thickness. Then, dry etch is used to define a desired pattern of the first material forming the low velocity frame 421. A thin metal-etch stop layer (300 Å of AlN, for example) (not shown) is deposited over the substrate 110, the cavity 115, and the integrated low velocity frame 421. The second material is deposited on a top surface of the substrate 110, the cavity 115, and the low velocity frame 421 and over the metal-etch stop layer using a spin-on, sputtering, evaporation or CVD technique, for example, to the desired thickness. The second material is then etched from the substrate 110 and from the low velocity frame 421, following application of a photoresist pattern (e.g., via photolithography), using sulfur hexafluoride (SF6)-based plasma etch, for example, forming the desired outside bottom electrode 426 pattern. Finally, CMP using aluminum oxide abrasive, for example, is performed to obtain a desired substantially planar outside bottom electrode 426. A layer of the first material is applied to the etched layer of the second material using a spin-on, sputtering, evaporation or CVD technique, for example, resulting in formation of the inside electrode layer 425. Of course, various other techniques may be incorporated, as would be apparent to one of ordinary skill in the art.

The integrated outer frame 421 in the outside electrode layer 426 effectively extends from the inside electrode layer 425 vertically through the outside electrode layer 426 in a direction away from the piezoelectric layer 130, such that the inner portion 422 of the outside electrode layer 426 is effectively embedded in the extended portion of the inside electrode layer 425. The integrated low velocity frame 421 at least partially surrounds the inner portion 422 of the outside layer 426. The integrated low velocity frame 421 is therefore located at an outer region of the bottom electrode 420 and the inner portion 422 of the outside layer 426 is located at a center region of the bottom electrode 420.

Similarly, the composite top electrode 440 has multiple electrode layers, including an inside electrode layer 445 formed adjacent to the piezoelectric layer 130 and an outside electrode layer 446 formed adjacent the inside electrode layer 445. Because the top electrode 440 is formed above the piezoelectric layer 130 in the orientation depicted in FIG. 4, the inside electrode layer 445 is formed first on the piezoelectric layer 130, and the outside electrode layer 446 is formed on the inside electrode layer 445. As discussed above, the inside electrode layer 445 is formed of the first material and the outside electrode layer 446 is formed of the first and second materials. For example, the inside electrode layer 445 may be formed by applying a layer of the first material to a top surface of the piezoelectric layer 130 using a spin-on, sputtering, evaporation or CVD technique, for example, to the desired thickness. A thin metal-stop etch layer (300 Å layer of AlN, for example)(not shown) and a layer of the first material is applied to the etched layer of the first material using a spin-on, sputtering, evaporation or CVD technique, for example. The formation of the outside electrode layer 446, including inner portion 442 and integrated low velocity frame 441 may be performed in a similar way as formation of the integrated low velocity frame 421 described above. Of course, various other techniques may be incorporated, as would be apparent to one of ordinary skill in the art. The top electrode 440 is then etched, following application of a photoresist pattern (e.g., via photolithography), using sulfur hexafluoride (SF6) based plasma etch, for example.

As a result, the integrated low velocity frame 441 of the outside electrode layer 446 effectively extends vertically from the inside electrode layer 445 through the outside electrode layer 446 in a direction away from the piezoelectric layer 130. The integrated low velocity frame 441 at least partially surrounds an inner portion 442 of the outside electrode layer 446, such that the inner portion 442 of the outside electrode layer 426 is effectively embedded in the extended portion of the inside electrode layer 425. The integrated low velocity frame 441 is therefore located at an outer region of the top electrode 440 and the inner portion 442 of the outside electrode layer 446 is located at a center region of the bottom electrode 420.

The operating characteristics of the integrated low velocity frames 421 and 441 may be controlled by adjusting one or more of the widths of the integrated low velocity frames 421 and 441, the thicknesses of the inside electrode layers 425, 445 and the outside electrode layers 426, 446 (which affects the thicknesses of the integrated low velocity frames 421 and 441), and the types of material used to form the inside electrode layers 425, 445 and the outside electrode layers 426, 446. For example, each of the bottom electrode 420 and the top electrode 440 may have a total thickness of approximately 1000 Å to approximately 20000 Å, with each of the inside electrode layers 425, 445 and outside electrode layer 426, 446 being approximately 10 percent to 90 percent fraction of the total thickness of the corresponding bottom or top electrode 420, 440 at the center region. In various embodiments, the bottom and top electrodes 420 and 440 and corresponding inside electrode layers 425, 445 and outside electrode layers 426, 446 may have the same or different thicknesses from one another. Each of the integrated low velocity frames 421 and 441 may have a width of approximately 0.1 µm to approximately 10 µm, for example. The thicknesses of the integrated low velocity frames 421 and 441 are determined by the relative thicknesses of the outside electrode layers 426 and 446, respectively. In various embodiments, the integrated low velocity frames 421 and 441 may have the same or different widths and thicknesses from one another. In other embodiments the integrated low velocity frames 421 and 441 may be misaligned with respect to each other, as well as may have different widths. The respective dimensions of the bottom and top electrodes 420 and 440, inside electrode layers 425 and 445, the outside electrode layers 426 and 446, and the integrated low velocity frames 421 and 441, may vary to provide unique benefits for any particular situation or to meet application specific design requirements of various implementations.

As mentioned above with reference to FIG. 1, in alternative configurations, the FBAR 400 may include only one composite electrode (bottom electrode 420 or top electrode 440) having an integrated low velocity frame (integrated low velocity frame 421 or integrated low velocity frame 441), without departing from the scope of the present teachings. When only one of the electrodes includes an integrated low velocity frame, the other electrode may be formed of a single material or may also be a composite electrode (without a lateral feature or with a different type of lateral feature).

Figure 5:
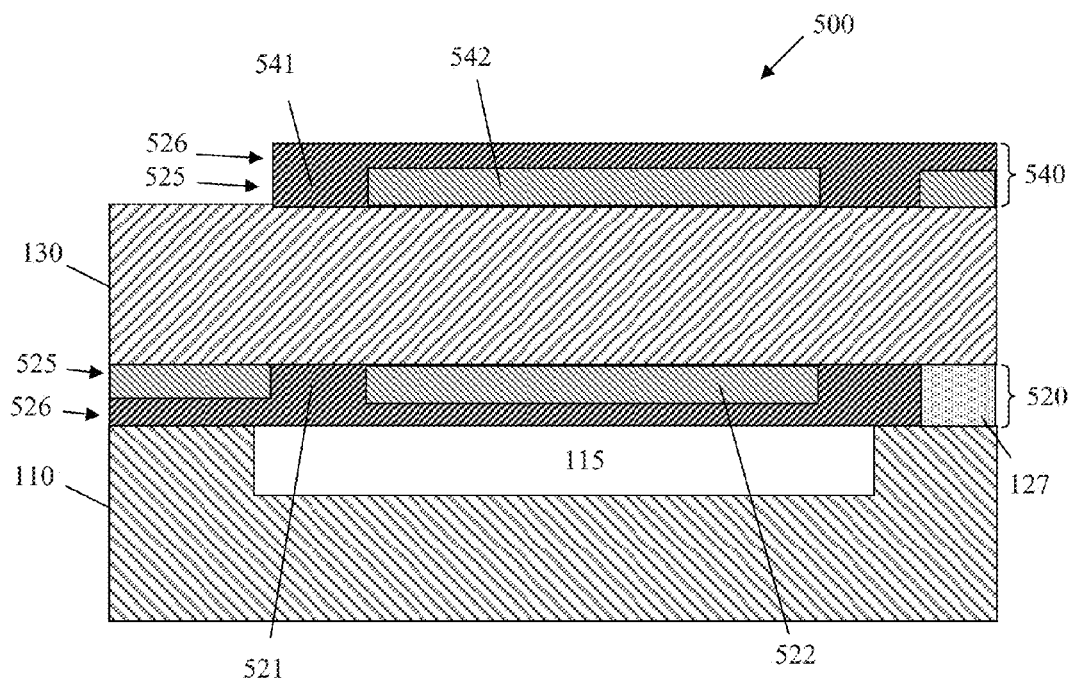
FIG. 5 is a cross-sectional diagram illustrating an acoustic resonator, including composite electrodes having multiple layers and integrated frames, according to a representative embodiment.

FIG. 5 is a cross-sectional diagram illustrating an acoustic resonator, including composite electrodes having multiple layers and integrated frames, according to another representative embodiment. Referring to FIG. 5, FBAR 500 includes a resonator stack comprising multiple layers stacked over substrate 110 having a cavity 115 for reflection of acoustic waves. The FBAR 500 further includes piezoelectric layer 130 sandwiched between two composite electrodes: A first or bottom electrode 520 and second or top electrode 540. In various embodiments, the bottom and top electrodes 520 and 540 may be formed of the same or different materials from one another. The substrate 110, the cavity 115, the piezoelectric layer 130 and the planarization layer 127 are substantially the same as discussed above with reference to FIG. 1.

In the depicted embodiment, the composite bottom electrode 520 has multiple electrode layers, including an inside electrode layer 525 formed adjacent to the piezoelectric layer 130 and an outside electrode layer 526 formed adjacent the inside electrode layer 525. The outside electrode layer 526 is formed of the first material and the inside electrode layer 525 is formed of the first and second materials, where the first material has a lower sound velocity than the second material. Because the bottom electrode 520 is formed beneath the piezoelectric layer 130 in the orientation depicted in FIG. 5, the outside electrode layer 526 is formed first on the substrate 110, the inside electrode layer 525 is then formed on the outside electrode layer 526, and the piezoelectric layer 130 is formed on the inside electrode layer 525. For example, the outside electrode layer 526 may be formed by applying a layer of the first material to a top surface of the substrate 110 and the cavity 115 (before releasing sacrificial material initially filling the cavity 115) using a spin-on, sputtering, evaporation or CVD technique, for example, to the desired thickness. A thin metal-stop etch layer (300 Å of AlN, for example) (not shown) is deposited over the outside electrode layer 526 and the formation of integrated low velocity frame 521 may be then performed in a similar manner as described above with regard to formation of the integrated low velocity frame 421. Of course, various other techniques may be incorporated, as would be apparent to one of ordinary skill in the art.

The arrangement of the inside and outside electrode layers 525 and 526 is essentially the opposite of the arrangement of the inside and outside electrode layers 425 and 426, discussed above, with regard to formation of integrated frames. That is, the integrated low velocity frame 521 of the inside electrode layer 525 effectively extends vertically from the outside electrode layer 526 through the inside electrode layer 525 in a direction toward the piezoelectric layer 130, such that the inner portion 522 of the inside electrode layer 525 is effectively embedded in the extended portion of the outside electrode layer 526. The integrated low velocity frame 521 at least partially surrounds inner portion 522 of the inside layer 525. The integrated low velocity frame 521 is therefore located at an outer region of the bottom electrode 520 and the inner portion 522 of the inside layer 525 is located at a center region of the bottom electrode 520.

Similarly, the composite top electrode 540 has multiple electrode layers, including an inside electrode layer 545 formed adjacent to the piezoelectric layer 130 and an outside electrode layer 546 formed adjacent the inside electrode layer 545. Because the top electrode 540 is formed above the piezoelectric layer 130 in the orientation depicted in FIG. 5, the inside electrode layer 525 is formed first on the piezoelectric layer 130, and the outside electrode layer 526 is formed on the inside electrode layer 525. As discussed above, the outside electrode layer 546 is formed of the first material and the inside electrode layer 545 is formed of the first and second materials. For example, the inside electrode layer 545 with the integrated low velocity frame 541 may be formed in a similar manner as discussed above with regard to the outside electrode layer 426 with the integrated low velocity frame 426. A layer of the first material is applied to the inside electrode layer 545 using a spin-on, sputtering, evaporation or CVD technique, for example, resulting in formation of the outside electrode layer 546. Of course, various other techniques may be incorporated, as would be apparent to one of ordinary skill in the art.

The integrated low velocity frame 541 of the inside electrode layer 525 effectively extends vertically from the outside electrode layer 546 through the inside electrode layer 545 in a direction toward the piezoelectric layer 130, such that inner portion 542 of the inside electrode layer 545 is effectively embedded in the extended portion of the outside electrode layer 546. The integrated low velocity frame 541 at least partially surrounds inner portion 542 of the inside electrode layer 545. The integrated low velocity frame 541 is therefore located at an outer region of the top electrode 540 and the inner portion 542 of the inside electrode layer 546 is located at a center region of the bottom electrode 520.

The operating characteristics of the integrated low velocity frames 521 and 541 may be controlled by adjusting one or more of the widths of the integrated low velocity frames 521 and 541, the thicknesses of the inside electrode layers 525, 545 and the outside electrode layers 526, 546 (which affect the heights of the integrated low velocity frames 521 and 541), and the types of material used to form the inside electrode layers 525, 545 and the outside electrode layers 526, 546. For example, each of the bottom electrode 520 and the top electrode 540 may have a total thickness of approximately 1000 Å to approximately 20000 Å, with each of the inside electrode layers 525, 545 and outside electrode layers 526, 546 being approximately 10 percent to 90 percent fraction of the total thickness of the corresponding bottom or top electrode 520, 540 in the center region. In various embodiments, the bottom and top electrodes 520 and 540 and corresponding inside electrode layers 525, 545 and the outside electrode layers 526, 546 may have the same or different thicknesses from one another. Each of the integrated low velocity frames 521 and 541 may have a width of approximately 0.1 µm to approximately 10 µm, for example. In various embodiments, the integrated low velocity frames 521 and 541 may have the same or different widths and thicknesses from one another. In other embodiments, the integrated low velocity frames 521 and 541 may be misaligned with respect to each other, as well as may have different widths and thicknesses. The respective dimensions of the bottom and top electrodes 520 and 540, inside electrode layers 525 and 545, the outside electrode layers 526 and 546, and the integrated low velocity frames 521 and 541, may vary to provide unique benefits for any particular situation or to meet application specific design requirements of various implementations.

As mentioned above with reference to FIG. 1, in alternative configurations, the FBAR 500 may include only one composite electrode (bottom electrode 520 or top electrode 540) having an integrated inner frame (integrated low velocity frame 521 or integrated low velocity frame 541), without departing from the scope of the present teachings. When only one of the electrodes includes an integrated low velocity frame, the other electrode may be formed of a single material or may also be a composite electrode (without a lateral feature or with a different type of lateral feature).

It should be pointed out that selection of metal for the first and second materials described in regard to FIGS. 4 and 5 allows for more precise tuning of low (and high) velocity frame properties than the embodiment described in FIG. 1 (and FIG. 2). Further, in various alternative configurations, FBARs 400 and 500 may be formed to include integrated high velocity frames, as first described in regard to FIG. 2, in place of the integrated low velocity frames, without departing from the scope of the present teachings. This may be accomplished by replacing the low velocity material (the first material) with the high velocity material (the second material), and vice versa. For example, the first material of the integrated low velocity frames (421, 441, 521 and 541) may be replaced with the second material, and the second material of the inner portions (422, 442, 522 and 542) may be replaced with the first material, in order to provide integrated high velocity frames in place of the integrated low velocity frames. Likewise, combinations of integrated low velocity and high velocity frames, first described with regard to FIG. 3, may be provided based on the configurations described in FIGS. 4 and 5 by replacing the low velocity material with the high velocity metal, and vice versa, in either of top electrode 440, 540 or the bottom electrode 420, 520, and by properly aligning the integrated high velocity frame with respect to the integrated low velocity frame. Lastly, illustratively the above descriptions consider only two metals with different sound velocities and acoustic impedances. In general, any of the integrated frames 421, 441, 521 and 541 may be formed of a third material (and additional materials, if needed), which may be yet another metal (aluminum or copper or gold, for example) or a dielectric (SiC, SiO, AlN, ZnO, for example) providing desired shift in cutoff frequency of the frame region, without departing from a scope of present teachings.

Figure 6:
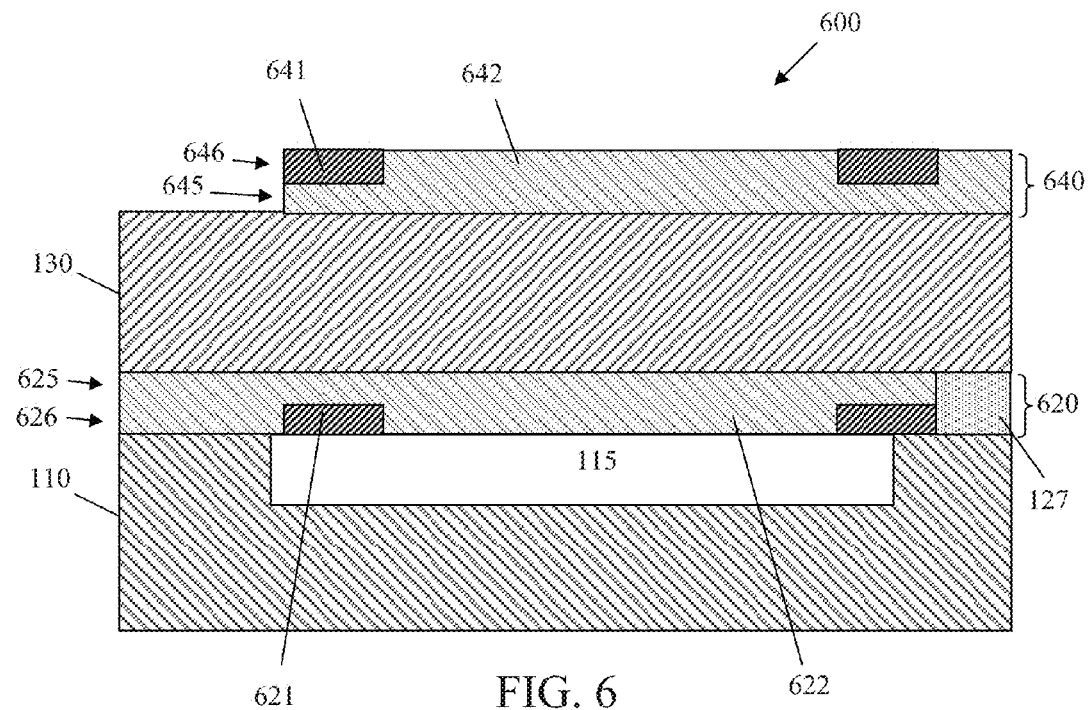
FIG. 6 is a cross-sectional diagram illustrating an acoustic resonator, including composite electrodes having multiple layers and integrated frames, according to a representative embodiment.

FIG. 6 is a cross-sectional diagram illustrating an acoustic resonator, including composite electrodes having multiple layers and integrated frames, according to another representative embodiment. Referring to FIG. 6, FBAR 600 includes a resonator stack comprising multiple layers stacked over substrate 110 having a cavity 115 for reflection of acoustic waves. The FBAR 600 further includes piezoelectric layer 130 sandwiched between two composite electrodes: A first or bottom electrode 620 and second or top electrode 640. In various embodiments, the bottom and top electrodes 620 and 640 may be formed of the same or different materials from one another. The substrate 110, the cavity 115, the piezoelectric layer 130 and the planarization layer 127 are substantially the same as discussed above with reference to FIG. 1.

In the depicted embodiment, the composite bottom electrode 620 has multiple electrode layers, including an inside electrode layer 625 formed adjacent to the piezoelectric layer 130 and an outside electrode layer 626 formed adjacent the inside electrode layer 625. In the depicted example, the outside electrode layer 626 is formed of the first and second materials and the inside electrode layer 625 is formed of the second material, where the first material has a lower sound velocity than the second material. Because the bottom electrode 620 is formed beneath the piezoelectric layer 130 in the orientation depicted in FIG. 6, the outside electrode layer 626 is formed first on the substrate 110, the inside electrode layer 625 is then formed on the outside electrode layer 626, and the piezoelectric layer 130 is formed on the inside electrode layer 625. For example, with regard to the outside electrode layer 626, the integrated low velocity frame 621 may be formed by applying a layer of the first material to a top surface of the substrate 110 and the cavity 115 (before releasing sacrificial material initially filling the cavity 115) using a spin-on, sputtering, evaporation or CVD technique, for example, to the desired thickness. Then, dry etch is used to define a desired pattern of the first material forming the integrated low velocity frame 621. A thin metal-etch stop layer (300 Å of AlN, for example) (not shown) is deposited over the substrate 110, the cavity 115, and the integrated low velocity frame 621. The second material is then deposited on a top surface of the substrate 110, the cavity 115, and the low velocity frame 621 and over the metal-etch stop layer using a spin-on, sputtering, evaporation or CVD technique, for example, to the desired thickness. The second material is then etched from the substrate 110 and from the low velocity frame 621, following application of a photoresist pattern (e.g., via photolithography), using sulfur hexafluoride (SF6)-based plasma etch, for example, forming the desired outside electrode layer 626 pattern. Finally, CMP using aluminum oxide abrasive, for example, is performed to obtain a desired substantially planar outside electrode layer 626. A layer of the second material is applied to the outside electrode layer 626 using a spin-on, sputtering, evaporation or CVD technique, for example, resulting in formation of the inside electrode layer 625 Of course, various other techniques may be incorporated, as would be apparent to one of ordinary skill in the art.

As a result, the integrated low velocity frame 621 is separated from the piezoelectric layer 130 by the inside electrode layer 625, effectively embedding the integrated low velocity frame 621 in the bottom electrode 620. The inner portion 622 of the outside electrode layer 626 is at least partially surrounded by the integrated low velocity frame 621 of the outside electrode layer 626. The integrated low velocity frame 621 is therefore located at an outer region of the bottom electrode 620 and the inner portion 622 is located at a center region of the bottom electrode 620. Notably, the integrated low velocity frame 621 is similar to the integrated low velocity frame 121 in FBAR 100, discussed above with reference to FIG. 1, except that the integrated low velocity frame 621 does not pass through the entire thickness of the bottom electrode 620. Therefore, the thickness of the integrated low velocity frame 621 may be varied (by varying the thickness of the outside electrode layer 626) without varying the total thickness of the bottom electrode 620.

Similarly, the composite top electrode 640 has multiple electrode layers, including an inside electrode layer 645 formed adjacent to the piezoelectric layer 130 and an outside electrode layer 646 formed adjacent the inside electrode layer 645. Because the top electrode 640 is formed above the piezoelectric layer 130 in the orientation depicted in FIG. 6, the inside electrode layer 645 is formed first on the piezoelectric layer 130, and the outside electrode layer 646 is formed on the inside electrode layer 645. As discussed above, the outside electrode layer 646 is formed of the first and second materials and the inside electrode layer 645 is formed of the second material. For example, the inside electrode layer 645 may be formed by applying a layer of the second material to a top surface of the piezoelectric layer 130 using a spin-on, sputtering, evaporation or CVD technique, for example, to the desired thickness. A thin metal-etch stop layer (300 Å of AlN, for example) (not shown) may be then deposited. The formation of the integrated low velocity frame 641 as part of the outside layer 646 may be then performed in a similar manner as formation of the integrated low velocity frame 621, discussed above. Of course, various other techniques may be incorporated, as would be apparent to one of ordinary skill in the art.

As a result, the integrated low velocity frame 641 is effectively embedded in the top electrode 640. The integrated low velocity frame 641 at least partially surrounds inner portion 642 of the outside electrode layer 646. The integrated low velocity frame 641 is therefore located at an outer region of the top electrode 640 and the inner portion 642 is located at a center region of the top electrode 640. As discussed above in regard to the integrated low velocity frame 621, the integrated low velocity frame 641 is similar to the integrated low velocity frame 141 in FBAR 100, except that the integrated low velocity frame 641 does not pass through the entire thickness of the top electrode 640. Therefore, the thickness of the integrated low velocity frame 641 may be varied (by varying the thickness of the outside electrode layer 646) without varying the total thickness of the top electrode 640.

The operating characteristics of the integrated low velocity frames 621 and 641 may be controlled by adjusting one or more of the widths of the integrated low velocity frames 621 and 641, the thicknesses of the inside electrode layers 625, 645 and the outside electrode layers 626, 646 (which affect the thicknesses of the integrated low velocity frames 621 and 641), and the types of material used to form the inside electrode layers 625, 645 and the outside electrode layers 626, 646. For example, each of the bottom electrode 620 and the top electrode 640 may have a total thickness of approximately 1000 Å to approximately 20000 Å. The outside electrode layers 626 and 646 (corresponding in thickness to the integrated low velocity frames 621 and 641, respectively) may be approximately 10 percent to 90 percent fraction of the total thickness of the corresponding bottom or top electrode 620 and 640. In various embodiments, the bottom and top electrodes 620 and 640 and corresponding inside electrode layers 625, 645 and the outside electrode layers 626 and 646 may have the same or different thicknesses from one another, respectively. In other embodiments, the integrated low velocity frames 621 and 641 may be misaligned with respect to each other. Each of the integrated low velocity frames 621 and 641 may have a width of approximately 0.1 µm to approximately 10 µm, for example. In various embodiments, the integrated low velocity frames 621 and 641 may have the same or different widths and thicknesses from one another. The respective dimensions of the bottom and top electrodes 620 and 640, the inside electrode layers 625 and 645, the outside electrode layers 626 and 646, and the integrated low velocity frames 621 and 641, may vary to provide unique benefits for any particular situation or to meet application specific design requirements of various implementations.

As mentioned above with reference to FIG. 1, in alternative configurations, the FBAR 600 may include only one composite electrode (bottom electrode 620 or top electrode 640) having an integrated low velocity frame (integrated low velocity frame 621 or integrated low velocity frame 641), without departing from the scope of the present teachings. When only one of the electrodes includes an integrated low velocity frame, the other electrode may be formed of a single material or may also be a composite electrode (without a lateral feature or with a different type of lateral feature).

Figure 7:
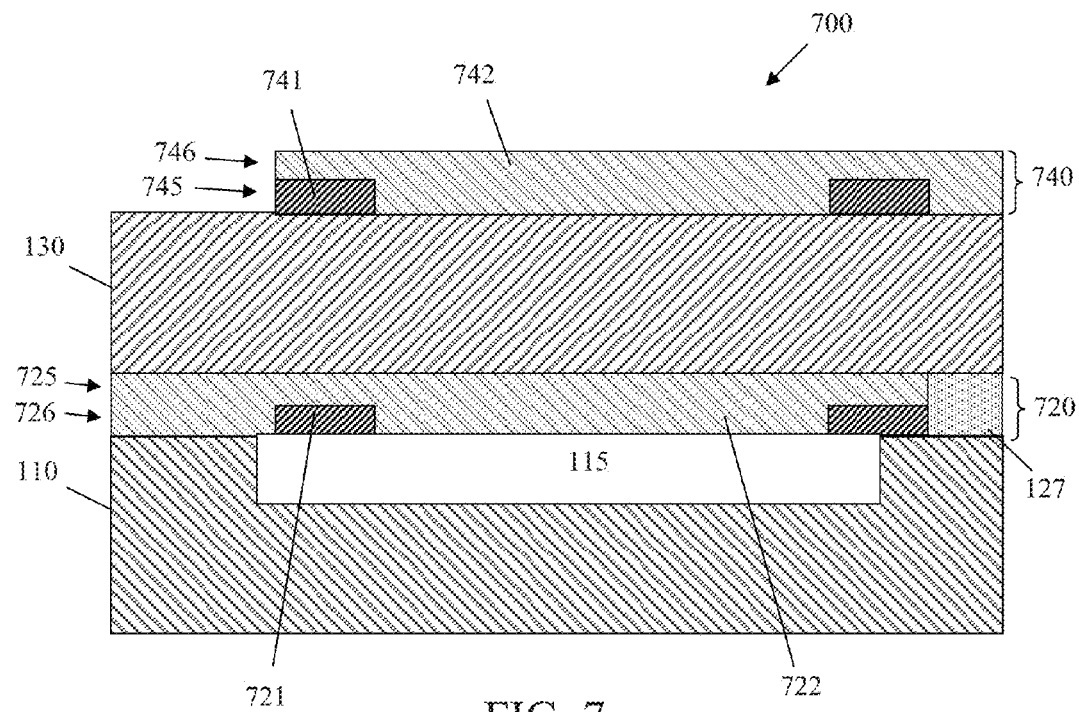
FIG. 7 is a cross-sectional diagram illustrating an acoustic resonator, including composite electrodes having multiple layers and integrated frames, according to a representative embodiment.

FIG. 7 is a cross-sectional diagram illustrating an acoustic resonator, including composite electrodes having multiple layers and integrated frames, according to another representative embodiment. Referring to FIG. 7, FBAR 700 includes a resonator stack comprising multiple layers stacked over substrate 110 having a cavity 115 for reflection of acoustic waves. The FBAR 700 further includes piezoelectric layer 130 sandwiched between two composite electrodes: A first or bottom electrode 720 and second or top electrode 740. In various embodiments, the bottom and top electrodes 720 and 740 may be formed of the same or different materials from one another. The substrate 110, the cavity 115, the piezoelectric layer 130 and the planarization layer 127 are substantially the same as discussed above with reference to FIG. 1.

In the depicted embodiment, the composite bottom electrode 720 has multiple electrode layers, including an inside electrode layer 725 formed adjacent to the piezoelectric layer 130 and an outside electrode layer 726 formed adjacent the inside electrode layer 725. The outside electrode layer 726 is formed of the first and second materials and the inside electrode layer 725 is formed of the second material, where the first material has a lower sound velocity than the second material. Because the bottom electrode 720 is formed beneath the piezoelectric layer 130 in the orientation depicted in FIG. 7, the outside electrode layer 726 is formed first on the substrate 110, the inside electrode layer 725 is then formed on the outside electrode layer 726, and the piezoelectric layer 130 is formed on the inside electrode layer 725. More particularly, the outside electrode layer 726 includes integrated low velocity frame 721, which at least partially surrounds inner portion 722 of the outside layer 726. The integrated low velocity frame 721 is therefore located at an outer region of the bottom electrode 720 and the inner portion 722 is located at a center region of the bottom electrode 720. The inside electrode layer 725 is formed on the outside electrode layer 726, separating the integrated low velocity frame 721 from the piezoelectric layer 130, and thus effectively burying the integrated low velocity frame 721 in the lower electrode 720. The bottom electrode 720 is essentially the same and formed in the same manner as bottom electrode 620 described above.

The composite top electrode 740 also has multiple electrode layers, including an inside electrode layer 745 formed adjacent to the piezoelectric layer 130 and an outside electrode layer 746 formed adjacent the inside electrode layer 745. Because the top electrode 740 is formed above the piezoelectric layer 130 in the orientation depicted in FIG. 7, the inside electrode layer 745 is formed first on the piezoelectric layer 130, and the outside electrode layer 746 is formed on the inside electrode layer 745. The outside electrode layer 746 is formed of the second material and the inside electrode layer 745 is formed of the first and second material. The top electrode 740 is essentially the same and formed in the same manner as bottom electrode 720 described above. Of course, various other techniques may be incorporated, as would be apparent to one of ordinary skill in the art.

Notably, in FIG. 7, the arrangement of the inside and outside electrode layers 745 and 746 is reversed as compared to the inside and outside electrode layers 725 and 726, in that the integrated low velocity frame 741 is formed as part of the inside electrode layer 745, and not the outside electrode layer 746. Accordingly, the integrated low velocity frame 741 is adjacent the piezoelectric layer 130 and effectively embedded in the top electrode 740. The integrated low velocity frame 741 at least partially surrounds the inner portion 742 of the inside electrode layer 745. The integrated low velocity frame 741 is therefore located at an outer region of the top electrode 740, and the inner portion 742 is located at a center region of the top electrode 740. As discussed above in regard to the integrated low velocity frame 721, the integrated low velocity frame 741 is similar to the integrated low velocity frame 141 in FBAR 100, except that the integrated low velocity frame 741 does not pass through the entire thickness of the top electrode 740.

The operating characteristics of the integrated low velocity frames 721 and 741 may be controlled by adjusting one or more of the widths of the integrated low velocity frames 721 and 741, the thicknesses of the outside electrode layer 726 and the inside electrode layer 745 (which affect the thicknesses of the integrated low velocity frames 721 and 741), and the types of material used to form the inside electrode layers 725 and 745 and the outside electrode layers 726 and 746. For example, each of the bottom electrode 720 and the top electrode 740 may have a total thickness of approximately 1000 Å to approximately 20000 Å. Each of the outside electrode layer 726 (corresponding in thickness to the integrated low velocity frame 721) and the inside electrode layer 745 (corresponding in thickness to the integrated low velocity frame 741) may be approximately 10 percent to 90 percent fraction of the total thickness of the corresponding bottom or top electrode 720 and 740. In various embodiments, the bottom and top electrodes 720 and 740 and corresponding inside electrode layers 725, 745 and the outside electrode layers 726 and 746 may have the same or different thicknesses from one another, respectively. In other embodiments, as mentioned above, the integrated low velocity frames 721 and 741 may be misaligned with respect to each other. Each of the integrated low velocity frames 721 and 741 may have a width of approximately 0.1 µm to approximately 10 µm, for example. In various embodiments, the integrated low velocity frames 721 and 741 may have the same or different widths and thicknesses from one another. The respective dimensions of the bottom and top electrodes 720 and 740, the inside electrode layers 725 and 745, the outside electrode layers 726 and 746, and the integrated low velocity frames 721 and 741, may vary to provide unique benefits for any particular situation or to meet application specific design requirements of various implementations.

As mentioned above with reference to FIG. 1, in alternative configurations, the FBAR 700 may include only one composite electrode (bottom electrode 720 or top electrode 740) having an integrated low velocity frame (integrated low velocity frame 721 or integrated low velocity frame 741), without departing from the scope of the present teachings. When only one of the electrodes includes an integrated low velocity frame, the other electrode may be formed of a single material or may also be a composite electrode (without a lateral feature or with a different type of lateral feature). Also, in an alternative embodiment, the configuration of the bottom electrode 720 may be the mirror image of the top electrode 740, without departing from the scope of the present teachings. In other words, the integrated low velocity frame 721 would be included in the inside electrode layer 725, and the outside electrode layer 726 would be formed entirely of the second material. The integrated low velocity frame 721 would at least partially surround the inner portion 722 of the inside electrode layer 725. Accordingly, the integrated low velocity frame 721 would be adjacent the piezoelectric layer 130 and effectively embedded in the bottom electrode 720.

It should be pointed out that selection of metal for the first and second materials described in regard to FIGS. 6 and 7 allows for more precise tuning of low (and high) velocity frame properties than the one described in FIG. 1 (and FIG. 2). Further, in various alternative configurations, FBARs 600 and 700 may be formed to include integrated high velocity frames, as first described in regard to FIG. 2, in place of the integrated low velocity frames, without departing from the scope of the present teachings. This may be accomplished by replacing the low velocity material (the first material) with the high velocity material (the second material), and vice versa. For example, the first material of the integrated low velocity frames (621, 641, 721 and 741) may be replaced with the second material, and the second material of the inner portions (622, 642, 722 and 742) may be replaced with the first material, in order to provide integrated high velocity frames in place of the integrated low velocity frames. Likewise, combinations of integrated low velocity and high velocity frames, first described with regard to FIG. 3, may be provided based on the configurations described in FIGS. 6 and 7 by replacing the low velocity material with the high velocity metal, and vice versa, in either of top electrode 640, 740 or the bottom electrode 620, 720, and by properly aligning the integrated high velocity frame with respect to the integrated low velocity frame. Lastly, illustratively the above descriptions consider only two metals with different sound velocities and acoustic impedances. In general, any of the integrated frames 621, 641, 721 and 741 may be formed of a third material (and additional materials, if needed), which may be yet another metal (aluminum or copper or gold, for example) or a dielectric (SiC, SiO, AlN, ZnO, for example) providing desired shift in cutoff frequency of the frame region, without departing from a scope of present teachings.

Figure 8:
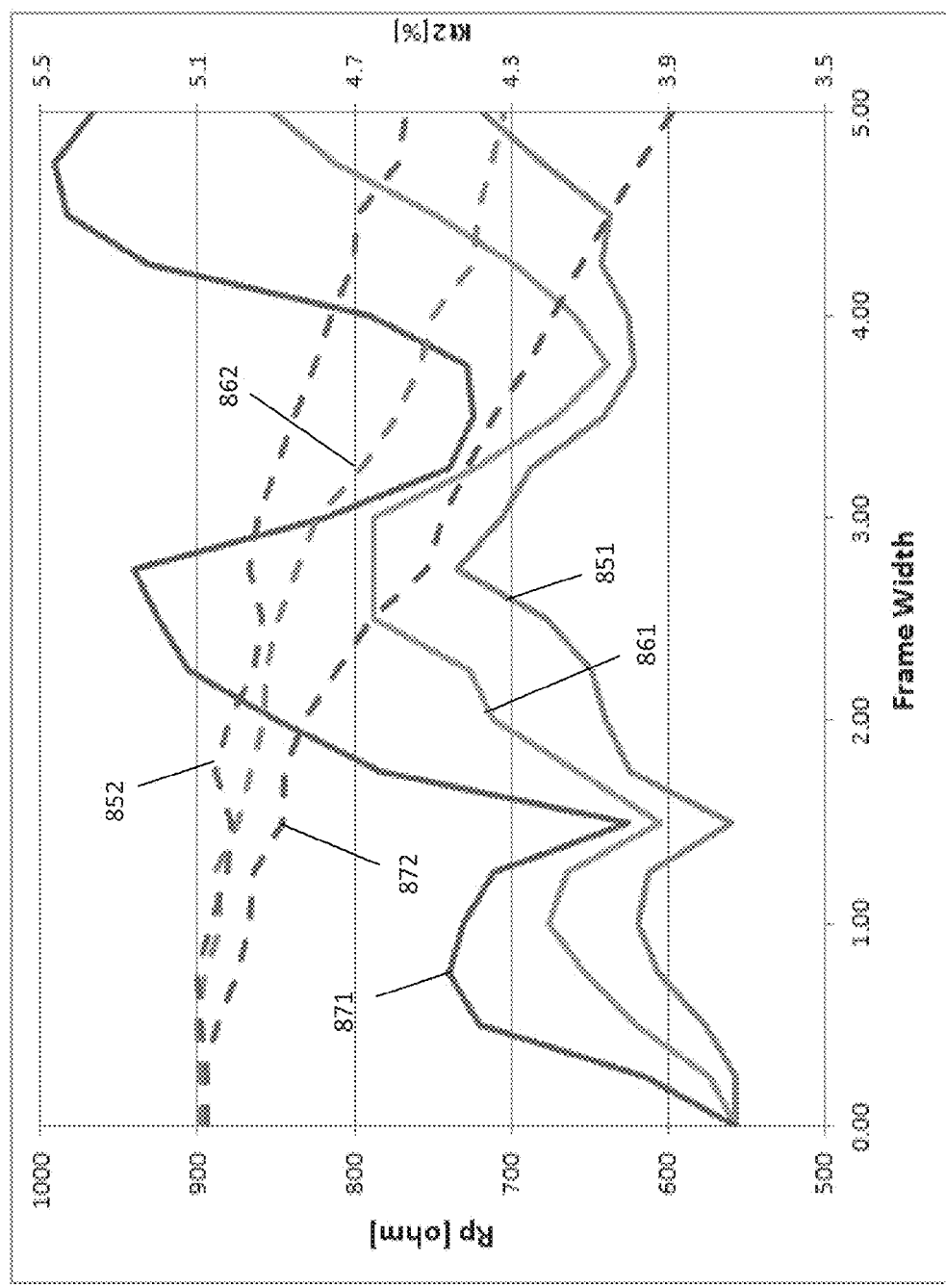
FIG. 8 is a graph illustrating parallel resistance Rp and coupling coefficient $kt^2$ versus frame width of an integrated frame having various thicknesses, according to representative embodiments.

FIG. 8 is a graph illustrating parallel resistance Rp (in ohms) and coupling coefficient Kt2 (as percentage of cut-off frequency) versus frame width (in µm) of integrated frames having various thicknesses, according to representative embodiments. For purposes of illustration, FIG. 8 was determined using an acoustic resonator configured substantially the same as FBAR 700, discussed above with reference to FIG. 7. For example, the representative FBAR 700 included a bottom electrode 720 having a thickness of approximately 3800 Å (with no lateral features), a piezoelectric layer 130 having a thickness of approximately 9300 Å, and a top electrode 740 having a thickness of approximately 3250 Å. The top electrode included an integrated low velocity frame 741 having varying thicknesses, as discussed below. The representative FBAR 700 also included an optional passivation layer formed of AlN, for example, having a thickness of approximately 2000Å. The various traces of FIG. 8 reflect different thicknesses (in the vertical direction) of the integrated low velocity frame 741, as discussed below.

Referring to FIG. 8, traces 851, 861 and 871 show parallel resistance Rp associated with different thicknesses of the integrated low velocity frame 741, and traces 852, 862 and 872 show coupling coefficient $kt^2$ associated with the different thicknesses of the integrated low velocity frame 741. More particularly, traces 851 and 852 correspond to an integrated low velocity frame 741 thickness of about 500 Å, traces 861 and 862 correspond to an integrated low velocity frame 741 thickness of about 1000 Å, and traces 861 and 862 correspond to an integrated low velocity frame 741 thickness of about 2000 Å.

In the depicted example, the thicker the integrated low velocity frame 741, the higher the parallel resistance Rp at any given width of the integrated low velocity frame 741. Also, generally, the thicker the integrated low velocity frame 741, the lower the coupling coefficient $kt^2$ at any given width of the integrated low velocity frame 741. In some applications requiring high band-width, the most favorable width of the integrated low velocity frame 741 (indicated on the horizontal axis) may correspond to the peak of the parallel resistance Rp with the highest corresponding coupling coefficient $kt^2$. So, for example, the most favorable width of an integrated low velocity frame 741 having a thickness of about 2000 Å is about 0.75 µm, indicated by the first peak of trace 871, since this peak has the highest corresponding coupling coefficient $kt^2$ indicated by trace 872. Notably, though, the optimal width of an integrated frame may be relatively small compared to manufacturing tolerances, thus a wider frame width is generally preferable. Therefore, as the results shown by FIG. 8 indicate, a similar performance with respect to the parallel resistance Rp and the coupling coefficient $kt^2$ may be selected using a 500 Å thick and 2.75 µm wide integrated low velocity frame, where the parallel resistance Rp is indicated by the second peak of trace 851 and the corresponding coupling coefficient $kt^2$ is indicated by trace 852 at the same width. This example indicates the importance of having frame thickness as a design degree of freedom, even if the total thickness in the frame region is fixed by the top electrode 740 thickness.

It is understood that the specific configurations of the FBARs 100 to 700, discussed above, are illustrative, and that the various parameters and characteristics described herein may vary to provide unique benefits for any particular situation or to meet application specific design requirements. Further, various alternative combinations of integrated low velocity and high velocity frames may be incorporated, without departing from the scope of the present teachings.

In addition, although each of the representative integrated low velocity and high velocity frames discussed above has a rectangular cross-sectional shape, it is understood that they may include other cross-section shapes and/or may include multiple lateral interfaces within the composite electrode, such as stepped structures. Examples of frames having multiple lateral interfaces are included in U.S. patent application Ser. No. 13/232,334, to Burak et al., filed Sep. 14, 2011, which is hereby incorporated by reference in its entirety. The multiple lateral interfaces may provide improved selected mode confinement and/or suppression.

Notably, the teachings of the incorporated patents and patent applications are intended to be illustrative of methods, materials and structures useful to the present teachings, but in no way limiting to the present teachings. The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A bulk acoustic wave (BAW) resonator device, comprising:
a bottom composite electrode on a substrate over one of a cavity and an acoustic reflector, the bottom composite electrode including a bottom inner portion and a bottom integrated frame, the bottom integrated frame being arranged between planar top and bottom surfaces of the bottom composite electrode and configured to create at least one of a cut-off frequency mismatch and an acoustic impedance mismatch, wherein the bottom integrated frame and the bottom inner portion have substantially the same thickness;
a piezoelectric layer on the bottom electrode; and
a top composite electrode on the piezoelectric layer, the top composite electrode including a top inner portion and a top integrated frame, the top integrated frame being arranged between planar top and bottom surfaces of the top composite electrode and configured to create at least one of a cut-off frequency mismatch and an acoustic impedance mismatch, wherein the top integrated frame and the top inner portion have substantially the same thickness;
wherein the bottom and top integrated frames are positioned adjacent the piezoelectric layer at outer regions of the bottom and top composite electrodes, respectively, and substantially surround the bottom and top inner portions located at center regions of the bottom and top composite electrodes, respectively, and
wherein an inner edge of the bottom integrated frame, adjacent the bottom inner portion, is not vertically aligned with an inner edge of the top integrated frame, adjacent the top inner portion.

2. The BAW resonator device of claim 1, wherein the top integrated frame comprises an integrated low velocity frame, and the bottom integrated frame comprises an integrated high velocity frame.

3. The BAW resonator device of claim 2, wherein the integrated low velocity frame is formed of a first material and the integrated high velocity frame is formed of a second material, the first material having a lower sound velocity than the second material.

4. The BAW resonator device of claim 1, wherein the top integrated frame comprises an integrated high velocity frame, and the bottom integrated frame comprises an integrated low velocity frame.

5. The BAW resonator device of claim 1, wherein the inner edge of the top integrated frame is vertically aligned with an outer edge of bottom integrated frame.

6. A thin film bulk acoustic resonator (FBAR), comprising:
a bottom electrode on a substrate, the bottom electrode being formed of a first material and a second material, wherein the first material has a lower sound velocity than the second material;
a piezoelectric layer on the bottom electrode;
a top electrode on the piezoelectric layer, the top electrode being formed of the first material and the second material;
one of an integrated low velocity frame formed by the first material or an integrated high velocity frame formed by the second material within the bottom electrode at an outer region of the FBAR; and one of an integrated low velocity frame formed by the first material or an integrated high velocity frame formed by the second material within the top electrode at an outer region of the FBAR.

7. The FBAR of claim 6, wherein a thickness of the integrated low velocity frame is the same as a thickness of the top electrode.

8. The FBAR of claim 6, wherein a thickness of the integrated low velocity frame is less than a thickness of the top electrode.

9. A bulk acoustic wave (BAW) resonator device, comprising:
a bottom electrode on a substrate over one of a cavity and an acoustic reflector;
a piezoelectric layer on the bottom electrode; and
a top electrode on the piezoelectric layer;
wherein at least one of the bottom electrode and the top electrode comprises a composite electrode having an integrated frame, arranged between planar top and bottom surfaces of the composite electrode and configured to create at least one of a cut-off frequency mismatch and an acoustic impedance mismatch, and
wherein the composite electrode comprises an inside layer adjacent the piezoelectric layer and an outside layer adjacent the inside layer, and the integrated frame is located at an outer region of the composite electrode, and extending from the inside layer through the outside layer away from the piezoelectric layer or extending from the outside layer through the inside layer toward the piezoelectric layer.

10. The BAW resonator device of claim 9, wherein the integrated frame comprises an integrated low velocity frame located at the outer region of the composite electrode and extending from the inside layer through the outside layer away from the piezoelectric layer.

11. The BAW resonator device of claim 10, wherein the inside layer is formed of a first material and the outside layer is formed of a second material, the first material having a lower sound velocity than the second material.

12. The BAW resonator device of claim 9, wherein the integrated frame comprises an integrated low velocity frame located at the outer region of the composite electrode and extending from the outside layer through the inside layer toward the piezoelectric layer.

13. The BAW resonator device of claim 12, wherein the outside layer is formed of a first material and the inside layer is formed of a second material, the first material having a lower sound velocity than the second material.

14. The BAW resonator device of claim 9, wherein the integrated frame comprises an integrated high velocity frame located at the outer region of the composite electrode and extending from the inside layer through the outside layer away from the piezoelectric layer.

15. The BAW resonator device of claim 14, wherein the inside layer is formed of a second material and the outside layer is formed of a first material, the first material having a lower sound velocity than the second material.

16. The BAW resonator device of claim 9, wherein the integrated frame comprises an integrated high velocity frame located at the outer region of the composite electrode and extending from the outside layer through the inside layer toward the piezoelectric layer.

17. The BAW resonator device of claim 16, wherein the outside layer is formed of a second material and the inside layer is formed of a first material, the first material having a lower sound velocity than the second material.

* * * * *